(12) United States Patent
Katz et al.

(10) Patent No.: US 9,952,266 B2
(45) Date of Patent: Apr. 24, 2018

(54) OBJECT DETECTION FOR WIRELESS ENERGY TRANSFER SYSTEMS

(71) Applicant: WiTricity Corporation, Watertown, MA (US)

(72) Inventors: Noam Katz, Norwood, MA (US); Arunanshu Mohan Roy, Norwood, MA (US); Jude R. Jonas, Hudson, NH (US); Morris P. Kesler, Bedford, MA (US)

(73) Assignee: WiTricity Corporation, Watertown, WA (US)

( * ) Notice: Subject to any disclaimer, the term of this patent is extended or adjusted under 35 U.S.C. 154(b) by 454 days.

(21) Appl. No.: 14/622,690

(22) Filed: Feb. 13, 2015

(65) Prior Publication Data

US 2015/0233988 A1    Aug. 20, 2015

Related U.S. Application Data

(60) Provisional application No. 61/940,310, filed on Feb. 14, 2014.

(51) Int. Cl.
*H04N 5/225* (2006.01)
*G01R 27/26* (2006.01)
(Continued)

(52) U.S. Cl.
CPC ......... *G01R 27/2605* (2013.01); *G01R 17/04* (2013.01); *G01V 3/088* (2013.01);
(Continued)

(58) Field of Classification Search
CPC ... G01R 27/2605; G01R 17/04; B60L 11/182; B60L 11/14
(Continued)

(56) References Cited

U.S. PATENT DOCUMENTS

| 645,576 A | 3/1900 | Tesla |
| 649,621 A | 5/1900 | Tesla |

(Continued)

FOREIGN PATENT DOCUMENTS

| CA | 142352 | 8/1912 |
| CN | 102239633 | 11/2011 |

(Continued)

OTHER PUBLICATIONS

International Search Report and Written Opinion of the International Searching Authority for International Application No. PCT/US2015/015975 dated Sep. 2, 2015 (16 pages).

(Continued)

*Primary Examiner* — Dinh T Le
(74) *Attorney, Agent, or Firm* — Fish & Richardson P.C.

(57) ABSTRACT

The disclosure features living object detectors for a wireless energy transfer systems that include a sensor featuring a first conductor positioned adjacent to a first surface of a substrate, a shield featuring a second conductor different from the first conductor, where at least a portion of the second conductor is positioned proximal to the first conductor and adjacent to the first surface of the substrate, a ground reference featuring a third conductor spaced from the substrate and positioned on a side of the substrate opposite to the first surface, and an electrical circuit coupled to the first, second and third conductors and configured so that during operation of the living object detector, the electrical circuit applies a first electrical potential to the first conductor and a second electrical potential to the second conductor, the first and second electrical potentials being approximately similar.

19 Claims, 16 Drawing Sheets

(51) Int. Cl.
  *H02J 7/02* (2016.01)
  *H02J 50/12* (2016.01)
  *H02J 50/60* (2016.01)
  *H02J 50/70* (2016.01)
  *G01R 17/04* (2006.01)
  *H02J 5/00* (2016.01)
  *H02J 17/00* (2006.01)
  *G01V 3/08* (2006.01)

(52) U.S. Cl.
  CPC ............. *H02J 5/005* (2013.01); *H02J 7/025* (2013.01); *H02J 17/00* (2013.01); *H02J 50/12* (2016.02); *H02J 50/60* (2016.02); *H02J 50/70* (2016.02)

(58) Field of Classification Search
  USPC .................................................... 307/104, 97
  See application file for complete search history.

(56) References Cited

U.S. PATENT DOCUMENTS

| | | | |
|---|---|---|---|
| 787,412 A | 4/1905 | Tesla | |
| 1,119,732 A | 12/1914 | Tesla | |
| 2,133,494 A | 10/1938 | Waters | |
| 3,517,350 A | 6/1970 | Beaver | |
| 3,535,543 A | 10/1970 | Dailey | |
| 3,780,425 A | 12/1973 | Penn et al. | |
| 3,871,176 A | 3/1975 | Schukei | |
| 4,088,999 A | 5/1978 | Fletcher et al. | |
| 4,095,998 A | 6/1978 | Hanson | |
| 4,180,795 A | 12/1979 | Matsuda et al. | |
| 4,280,129 A | 7/1981 | Wells | |
| 4,450,431 A | 5/1984 | Hochstein | |
| 4,588,978 A | 5/1986 | Allen | |
| 4,766,368 A * | 8/1988 | Cox ...................... H03K 17/955 |
| | | | 324/662 |
| 5,027,709 A | 7/1991 | Slagle | |
| 5,033,295 A | 7/1991 | Schmid et al. | |
| 5,034,658 A | 7/1991 | Hiering et al. | |
| 5,053,774 A | 10/1991 | Schuermann et al. | |
| 5,070,293 A | 12/1991 | Ishii et al. | |
| 5,118,997 A | 6/1992 | El-Hamamsy | |
| 5,216,402 A | 6/1993 | Carosa | |
| 5,229,652 A | 7/1993 | Hough | |
| 5,287,112 A | 2/1994 | Schuermann | |
| 5,341,083 A | 8/1994 | Klontz et al. | |
| 5,367,242 A | 11/1994 | Hulman | |
| 5,374,930 A | 12/1994 | Schuermann | |
| 5,408,209 A | 4/1995 | Tanzer et al. | |
| 5,437,057 A | 7/1995 | Richley et al. | |
| 5,455,467 A | 10/1995 | Young et al. | |
| 5,493,691 A | 2/1996 | Barrett | |
| 5,522,856 A | 6/1996 | Reineman | |
| 5,528,113 A | 6/1996 | Boys et al. | |
| 5,541,604 A | 7/1996 | Meier | |
| 5,550,452 A | 8/1996 | Shirai et al. | |
| 5,565,763 A | 10/1996 | Arrendale et al. | |
| 5,630,835 A | 5/1997 | Brownlee | |
| 5,697,956 A | 12/1997 | Bornzin | |
| 5,703,461 A | 12/1997 | Minoshima et al. | |
| 5,703,573 A | 12/1997 | Fujimoto et al. | |
| 5,710,413 A | 1/1998 | King et al. | |
| 5,742,471 A | 4/1998 | Barbee, Jr. et al. | |
| 5,821,728 A | 10/1998 | Sshwind | |
| 5,821,731 A | 10/1998 | Kuki et al. | |
| 5,864,323 A | 1/1999 | Berthon | |
| 5,898,579 A | 4/1999 | Boys et al. | |
| 5,903,134 A | 5/1999 | Takeuchi | |
| 5,923,544 A | 7/1999 | Urano | |
| 5,940,509 A | 8/1999 | Jovanovich et al. | |
| 5,957,956 A | 9/1999 | Kroll et al. | |
| 5,959,245 A | 9/1999 | Moe et al. | |
| 5,986,895 A | 11/1999 | Stewart et al. | |
| 5,993,996 A | 11/1999 | Firsich | |
| 5,999,308 A | 12/1999 | Nelson et al. | |
| 6,012,659 A | 1/2000 | Nakazawa et al. | |
| 6,047,214 A | 4/2000 | Mueller et al. | |
| 6,066,163 A | 5/2000 | John | |
| 6,067,473 A | 5/2000 | Greeninger et al. | |
| 6,108,579 A | 8/2000 | Snell et al. | |
| 6,127,799 A | 10/2000 | Krishnan | |
| 6,176,433 B1 | 1/2001 | Uesaka et al. | |
| 6,184,651 B1 | 2/2001 | Fernandez et al. | |
| 6,207,887 B1 | 3/2001 | Bass et al. | |
| 6,232,841 B1 | 5/2001 | Bartlett et al. | |
| 6,238,387 B1 | 5/2001 | Miller, III | |
| 6,252,762 B1 | 6/2001 | Amatucci | |
| 6,436,299 B1 | 8/2002 | Baarman et al. | |
| 6,450,946 B1 | 9/2002 | Forsell | |
| 6,452,465 B1 | 9/2002 | Brown et al. | |
| 6,459,218 B2 | 10/2002 | Boys et al. | |
| 6,473,028 B1 | 10/2002 | Luc | |
| 6,483,202 B1 | 11/2002 | Boys | |
| 6,515,878 B1 | 2/2003 | Meins et al. | |
| 6,535,133 B2 | 3/2003 | Gohara | |
| 6,561,975 B1 | 5/2003 | Pool et al. | |
| 6,563,425 B2 | 5/2003 | Nicholson et al. | |
| 6,597,076 B2 | 7/2003 | Scheible et al. | |
| 6,609,023 B1 | 8/2003 | Fischell et al. | |
| 6,631,072 B1 | 10/2003 | Paul et al. | |
| 6,650,227 B1 | 11/2003 | Bradin | |
| 6,664,770 B1 | 12/2003 | Bartels | |
| 6,673,250 B2 | 1/2004 | Kuennen et al. | |
| 6,683,256 B2 | 1/2004 | Kao | |
| 6,696,647 B2 | 2/2004 | Ono et al. | |
| 6,703,921 B1 | 3/2004 | Wuidart et al. | |
| 6,731,071 B2 | 5/2004 | Baarman | |
| 6,749,119 B2 | 6/2004 | Scheible et al. | |
| 6,772,011 B2 | 8/2004 | Dolgin | |
| 6,798,716 B1 | 9/2004 | Charych | |
| 6,803,744 B1 | 10/2004 | Sabo | |
| 6,806,649 B2 | 10/2004 | Mollema et al. | |
| 6,812,645 B2 | 11/2004 | Baarman | |
| 6,825,620 B2 | 11/2004 | Kuennen et al. | |
| 6,831,417 B2 | 12/2004 | Baarman | |
| 6,839,035 B1 | 1/2005 | Addonisio et al. | |
| 6,844,702 B2 | 1/2005 | Giannopoulos et al. | |
| 6,856,291 B2 | 2/2005 | Mickle et al. | |
| 6,858,970 B2 | 2/2005 | Malkin et al. | |
| 6,906,495 B2 | 6/2005 | Cheng et al. | |
| 6,917,163 B2 | 7/2005 | Baarman | |
| 6,917,431 B2 | 7/2005 | Soljacic et al. | |
| 6,937,130 B2 | 8/2005 | Scheible et al. | |
| 6,960,968 B2 | 11/2005 | Odendaal et al. | |
| 6,961,619 B2 | 11/2005 | Casey | |
| 6,967,462 B1 | 11/2005 | Landis | |
| 6,975,198 B2 | 12/2005 | Baarman | |
| 6,988,026 B2 | 1/2006 | Breed et al. | |
| 7,027,311 B2 | 4/2006 | Vanderelli et al. | |
| 7,035,076 B1 | 4/2006 | Stevenson | |
| 7,042,196 B2 | 5/2006 | Ka-Lai et al. | |
| 7,069,064 B2 | 6/2006 | Govorgian et al. | |
| 7,084,605 B2 | 8/2006 | Mickle et al. | |
| 7,116,200 B2 | 10/2006 | Baarman et al. | |
| 7,118,240 B2 | 10/2006 | Baarman et al. | |
| 7,126,450 B2 | 10/2006 | Baarman et al. | |
| 7,127,293 B2 | 10/2006 | MacDonald | |
| 7,132,918 B2 | 11/2006 | Baarman et al. | |
| 7,147,604 B1 | 12/2006 | Allen et al. | |
| 7,180,248 B2 | 2/2007 | Kuennen et al. | |
| 7,191,007 B2 | 3/2007 | Desai et al. | |
| 7,193,418 B2 | 3/2007 | Freytag | |
| D541,322 S | 4/2007 | Garrett et al. | |
| 7,212,414 B2 | 5/2007 | Baarman | |
| 7,233,137 B2 | 6/2007 | Nakamura et al. | |
| D545,855 S | 7/2007 | Garrett et al. | |
| 7,239,110 B2 | 7/2007 | Cheng et al. | |
| 7,248,017 B2 | 7/2007 | Cheng et al. | |
| 7,251,527 B2 | 7/2007 | Lyden | |
| 7,288,918 B2 | 10/2007 | DiStefano | |
| 7,340,304 B2 | 3/2008 | MacDonald | |
| 7,375,492 B2 | 5/2008 | Calhoon et al. | |
| 7,375,493 B2 | 5/2008 | Calhoon et al. | |

(56) References Cited

U.S. PATENT DOCUMENTS

| | | |
|---|---|---|
| 7,378,817 B2 | 5/2008 | Calhoon et al. |
| 7,382,636 B2 | 6/2008 | Baarman et al. |
| 7,385,357 B2 | 6/2008 | Kuennen et al. |
| 7,443,135 B2 | 10/2008 | Cho |
| 7,462,951 B1 | 12/2008 | Baarman |
| 7,466,213 B2 | 12/2008 | Lobl et al. |
| 7,471,062 B2 | 12/2008 | Bruning |
| 7,474,058 B2 | 1/2009 | Baarman |
| 7,492,247 B2 | 2/2009 | Schmidt et al. |
| 7,514,818 B2 | 4/2009 | Abe et al. |
| 7,518,267 B2 | 4/2009 | Baarman |
| 7,521,890 B2 | 4/2009 | Lee et al. |
| 7,525,283 B2 | 4/2009 | Cheng et al. |
| 7,545,337 B2 | 6/2009 | Guenther |
| 7,554,316 B2 | 6/2009 | Stevens et al. |
| 7,599,743 B2 | 10/2009 | Hassler, Jr. et al. |
| 7,615,936 B2 | 11/2009 | Baarman et al. |
| 7,639,514 B2 | 12/2009 | Baarman |
| 7,741,734 B2 | 6/2010 | Joannopoulos et al. |
| 7,795,708 B2 | 9/2010 | Katti |
| 7,825,543 B2 | 11/2010 | Karalis et al. |
| 7,825,544 B2 | 11/2010 | Jansen et al. |
| 7,835,417 B2 | 11/2010 | Heideman et al. |
| 7,843,288 B2 | 11/2010 | Lee et al. |
| 7,844,306 B2 | 11/2010 | Shearer et al. |
| 7,863,859 B2 | 1/2011 | Soar |
| 7,880,337 B2 | 2/2011 | Farkas |
| 7,884,697 B2 | 2/2011 | Wei et al. |
| 7,885,050 B2 | 2/2011 | Lee |
| 7,919,886 B2 | 4/2011 | Tanaka |
| 7,923,870 B2 | 4/2011 | Jin |
| 7,932,798 B2 | 4/2011 | Tolle et al. |
| 7,948,209 B2 | 5/2011 | Jung |
| 7,952,322 B2 | 5/2011 | Partovi et al. |
| 7,963,941 B2 | 6/2011 | Wilk |
| 7,969,045 B2 | 6/2011 | Schmidt et al. |
| 7,994,880 B2 | 8/2011 | Chen et al. |
| 7,999,506 B1 | 8/2011 | Hollar et al. |
| 8,022,576 B2 | 9/2011 | Joannopoulos et al. |
| 8,035,255 B2 | 10/2011 | Kurs et al. |
| 8,076,800 B2 | 12/2011 | Joannopoulos et al. |
| 8,076,801 B2 | 12/2011 | Karalis et al. |
| 8,084,889 B2 | 12/2011 | Joannopoulos et al. |
| 8,097,983 B2 | 1/2012 | Karalis et al. |
| 8,106,539 B2 | 1/2012 | Schatz et al. |
| 8,115,448 B2 | 2/2012 | John |
| 8,131,378 B2 | 3/2012 | Greenberg et al. |
| 8,178,995 B2 | 5/2012 | Amano et al. |
| 8,193,769 B2 | 6/2012 | Azancot et al. |
| 8,212,414 B2 | 7/2012 | Howard et al. |
| 8,260,200 B2 | 9/2012 | Shimizu et al. |
| 8,304,935 B2 | 11/2012 | Karalis et al. |
| 8,324,759 B2 | 12/2012 | Karalis et al. |
| 8,334,620 B2 | 12/2012 | Park et al. |
| 8,362,651 B2 | 1/2013 | Hamam et al. |
| 8,395,282 B2 | 3/2013 | Joannopoulos et al. |
| 8,395,283 B2 | 3/2013 | Joannopoulos et al. |
| 8,400,017 B2 | 3/2013 | Kurs et al. |
| 8,400,018 B2 | 3/2013 | Joannopoulos et al. |
| 8,400,019 B2 | 3/2013 | Joannopoulos et al. |
| 8,400,020 B2 | 3/2013 | Joannopoulos et al. |
| 8,400,021 B2 | 3/2013 | Joannopoulos et al. |
| 8,400,022 B2 | 3/2013 | Joannopoulos et al. |
| 8,400,023 B2 | 3/2013 | Joannopoulos et al. |
| 8,400,024 B2 | 3/2013 | Joannopoulos et al. |
| 8,410,636 B2 | 4/2013 | Kurs et al. |
| 8,441,154 B2 | 5/2013 | Karalis et al. |
| 8,457,547 B2 | 6/2013 | Meskens |
| 8,461,719 B2 | 6/2013 | Kesler et al. |
| 8,461,720 B2 | 6/2013 | Kurs et al. |
| 8,461,721 B2 | 6/2013 | Karalis et al. |
| 8,461,722 B2 | 6/2013 | Kurs et al. |
| 8,461,817 B2 | 6/2013 | Martin et al. |
| 8,466,583 B2 | 6/2013 | Karalis et al. |
| 8,471,410 B2 | 6/2013 | Karalis et al. |
| 8,476,788 B2 | 7/2013 | Karalis et al. |
| 8,482,157 B2 | 7/2013 | Cook et al. |
| 8,482,158 B2 | 7/2013 | Kurs et al. |
| 8,487,480 B1 | 7/2013 | Kesler et al. |
| 8,497,601 B2 | 7/2013 | Hall et al. |
| 8,552,592 B2 | 10/2013 | Schatz et al. |
| 8,569,914 B2 | 10/2013 | Karalis et al. |
| 8,587,153 B2 | 11/2013 | Schatz et al. |
| 8,587,155 B2 | 11/2013 | Giler et al. |
| 8,598,743 B2 | 12/2013 | Hall et al. |
| 8,618,696 B2 | 12/2013 | Karalis et al. |
| 8,629,578 B2 | 1/2014 | Kurs et al. |
| 8,643,326 B2 | 2/2014 | Campanella et al. |
| 8,924,182 B2 * | 12/2014 | Berkcan ............... G01D 21/00 702/182 |
| 9,365,126 B2 * | 6/2016 | Widmer ............... B60L 11/182 |
| 2002/0032471 A1 | 3/2002 | Loftin et al. |
| 2002/0105343 A1 | 8/2002 | Scheible et al. |
| 2002/0118004 A1 | 8/2002 | Scheible et al. |
| 2002/0130642 A1 | 9/2002 | Ettes et al. |
| 2002/0167294 A1 | 11/2002 | Odaohhara |
| 2003/0038641 A1 | 2/2003 | Scheible |
| 2003/0062794 A1 | 4/2003 | Scheible et al. |
| 2003/0062980 A1 | 4/2003 | Scheible et al. |
| 2003/0071034 A1 | 4/2003 | Thompson et al. |
| 2003/0124050 A1 | 7/2003 | Yadav et al. |
| 2003/0126948 A1 | 7/2003 | Yadav et al. |
| 2003/0160590 A1 | 8/2003 | Schaefer et al. |
| 2003/0199778 A1 | 10/2003 | Mickle et al. |
| 2003/0214255 A1 | 11/2003 | Baarman et al. |
| 2004/0000974 A1 | 1/2004 | Odenaal et al. |
| 2004/0026998 A1 | 2/2004 | Henriott et al. |
| 2004/0100338 A1 | 5/2004 | Clark |
| 2004/0113847 A1 | 6/2004 | Qi et al. |
| 2004/0130425 A1 | 7/2004 | Dayan et al. |
| 2004/0130915 A1 | 7/2004 | Baarman |
| 2004/0130916 A1 | 7/2004 | Baarman |
| 2004/0142733 A1 | 7/2004 | Parise |
| 2004/0150934 A1 | 8/2004 | Baarman |
| 2004/0189246 A1 | 9/2004 | Bulai et al. |
| 2004/0201361 A1 | 10/2004 | Koh et al. |
| 2004/0222751 A1 | 11/2004 | Mollema et al. |
| 2004/0227057 A1 | 11/2004 | Tuominen et al. |
| 2004/0232845 A1 | 11/2004 | Baamian |
| 2004/0233043 A1 | 11/2004 | Yazawa et al. |
| 2004/0267501 A1 | 12/2004 | Freed et al. |
| 2005/0007067 A1 | 1/2005 | Baarman et al. |
| 2005/0021134 A1 | 1/2005 | Opie |
| 2005/0027192 A1 | 2/2005 | Govari et al. |
| 2005/0033382 A1 | 2/2005 | Single |
| 2005/0085873 A1 | 4/2005 | Gord et al. |
| 2005/0093475 A1 | 5/2005 | Kuennen et al. |
| 2005/0104064 A1 | 5/2005 | Hegarty et al. |
| 2005/0104453 A1 | 5/2005 | Vanderelli et al. |
| 2005/0116650 A1 | 6/2005 | Baarman |
| 2005/0116683 A1 | 6/2005 | Cheng et al. |
| 2005/0122058 A1 | 6/2005 | Baarman et al. |
| 2005/0122059 A1 | 6/2005 | Baarman et al. |
| 2005/0125093 A1 | 6/2005 | Kikuchi et al. |
| 2005/0127849 A1 | 6/2005 | Baarman et al. |
| 2005/0127850 A1 | 6/2005 | Baarman et al. |
| 2005/0127866 A1 | 6/2005 | Hamilton et al. |
| 2005/0135122 A1 | 6/2005 | Cheng et al. |
| 2005/0140482 A1 | 6/2005 | Cheng et al. |
| 2005/0151511 A1 | 7/2005 | Chary |
| 2005/0156560 A1 | 7/2005 | Shimaoka et al. |
| 2005/0189945 A1 | 9/2005 | Reidemian |
| 2005/0194926 A1 | 9/2005 | DiStefano |
| 2005/0253152 A1 | 11/2005 | Klimov et al. |
| 2005/0288739 A1 | 12/2005 | Hassler, Jr. et al. |
| 2005/0288740 A1 | 12/2005 | Hassler, Jr. et al. |
| 2005/0288741 A1 | 12/2005 | Hassler, Jr. et al. |
| 2005/0288742 A1 | 12/2005 | Giordano et al. |
| 2006/0001509 A1 | 1/2006 | Gibbs |
| 2006/0010902 A1 | 1/2006 | Trinh et al. |
| 2006/0022636 A1 | 2/2006 | Xian et al. |
| 2006/0053296 A1 | 3/2006 | Busboom et al. |
| 2006/0061323 A1 | 3/2006 | Cheng et al. |
| 2006/0066443 A1 | 3/2006 | Hall |

(56) References Cited

U.S. PATENT DOCUMENTS

| | | |
|---|---|---|
| 2006/0090956 A1 | 5/2006 | Peshkovskiy et al. |
| 2006/0132045 A1 | 6/2006 | Baarman |
| 2006/0164866 A1 | 7/2006 | Vanderelli et al. |
| 2006/0181242 A1 | 8/2006 | Freed et al. |
| 2006/0184209 A1 | 8/2006 | John et al. |
| 2006/0184210 A1 | 8/2006 | Singhal et al. |
| 2006/0185809 A1 | 8/2006 | Elfrink et al. |
| 2006/0199620 A1 | 9/2006 | Greene et al. |
| 2006/0202665 A1 | 9/2006 | Hsu |
| 2006/0205381 A1 | 9/2006 | Beart et al. |
| 2006/0214626 A1 | 9/2006 | Nilson et al. |
| 2006/0219448 A1 | 10/2006 | Grieve et al. |
| 2006/0238365 A1 | 10/2006 | Vecchione et al. |
| 2006/0270440 A1 | 11/2006 | Shearer et al. |
| 2006/0281435 A1 | 12/2006 | Shearer et al. |
| 2007/0010295 A1 | 1/2007 | Greene et al. |
| 2007/0013483 A1 | 1/2007 | Stewart |
| 2007/0016089 A1 | 1/2007 | Fischell et al. |
| 2007/0021140 A1 | 1/2007 | Keyes, IV et al. |
| 2007/0024246 A1 | 2/2007 | Flaugher |
| 2007/0064406 A1 | 3/2007 | Beart |
| 2007/0069687 A1 | 3/2007 | Suzuki |
| 2007/0096875 A1 | 5/2007 | Waterhouse et al. |
| 2007/0105429 A1 | 5/2007 | Kohl et al. |
| 2007/0117596 A1 | 5/2007 | Greene et al. |
| 2007/0126650 A1 | 6/2007 | Guenther |
| 2007/0145830 A1 | 6/2007 | Lee et al. |
| 2007/0164839 A1 | 7/2007 | Naito |
| 2007/0171681 A1 | 7/2007 | Baarman |
| 2007/0176840 A1 | 8/2007 | Pristas et al. |
| 2007/0178945 A1 | 8/2007 | Cook et al. |
| 2007/0182367 A1 | 8/2007 | Partovi |
| 2007/0208263 A1 | 9/2007 | John et al. |
| 2007/0222542 A1 | 9/2007 | Joannopoulos et al. |
| 2007/0257636 A1 | 11/2007 | Phillips et al. |
| 2007/0267918 A1 | 11/2007 | Gyland |
| 2007/0276538 A1 | 11/2007 | Kjellsson et al. |
| 2008/0012569 A1 | 1/2008 | Hall et al. |
| 2008/0014897 A1 | 1/2008 | Cook et al. |
| 2008/0030415 A1 | 2/2008 | Homan et al. |
| 2008/0036588 A1 | 2/2008 | Iverson et al. |
| 2008/0047727 A1 | 2/2008 | Sexton et al. |
| 2008/0051854 A1 | 2/2008 | Bulkes et al. |
| 2008/0067874 A1 | 3/2008 | Tseng |
| 2008/0132909 A1 | 6/2008 | Jascob et al. |
| 2008/0154331 A1 | 6/2008 | John et al. |
| 2008/0176521 A1 | 7/2008 | Singh et al. |
| 2008/0191638 A1 | 8/2008 | Kuennen et al. |
| 2008/0197710 A1 | 8/2008 | Kreitz et al. |
| 2008/0197802 A1 | 8/2008 | Onishi et al. |
| 2008/0211320 A1 | 9/2008 | Cook et al. |
| 2008/0238364 A1 | 10/2008 | Weber et al. |
| 2008/0255901 A1 | 10/2008 | Carroll et al. |
| 2008/0265684 A1 | 10/2008 | Farkas |
| 2008/0266748 A1 | 10/2008 | Lee |
| 2008/0272860 A1 | 11/2008 | Pance |
| 2008/0273242 A1 | 11/2008 | Woodgate et al. |
| 2008/0278264 A1 | 11/2008 | Karalis et al. |
| 2008/0291277 A1 | 11/2008 | Jacobsen et al. |
| 2008/0300657 A1 | 12/2008 | Stultz |
| 2008/0300660 A1 | 12/2008 | John |
| 2009/0010028 A1 | 1/2009 | Baarmen et al. |
| 2009/0015075 A1 | 1/2009 | Cook et al. |
| 2009/0033280 A1 | 2/2009 | Choi et al. |
| 2009/0033564 A1 | 2/2009 | Cook et al. |
| 2009/0038623 A1 | 2/2009 | Farbarik et al. |
| 2009/0045772 A1 | 2/2009 | Cook et al. |
| 2009/0051224 A1 | 2/2009 | Cook et al. |
| 2009/0058189 A1 | 3/2009 | Cook et al. |
| 2009/0058361 A1 | 3/2009 | John |
| 2009/0067198 A1 | 3/2009 | Graham et al. |
| 2009/0072627 A1 | 3/2009 | Cook et al. |
| 2009/0072628 A1 | 3/2009 | Cook et al. |
| 2009/0072629 A1 | 3/2009 | Cook et al. |
| 2009/0072782 A1 | 3/2009 | Randall |
| 2009/0079268 A1 | 3/2009 | Cook et al. |
| 2009/0079387 A1 | 3/2009 | Jin et al. |
| 2009/0085408 A1 | 4/2009 | Bruhn |
| 2009/0085706 A1 | 4/2009 | Baarman et al. |
| 2009/0096413 A1 | 4/2009 | Patovi et al. |
| 2009/0102292 A1 | 4/2009 | Cook et al. |
| 2009/0108679 A1 | 4/2009 | Porwal |
| 2009/0108997 A1 | 4/2009 | Patterson et al. |
| 2009/0115628 A1 | 5/2009 | Dicks et al. |
| 2009/0127937 A1 | 5/2009 | Widmer et al. |
| 2009/0134712 A1 | 5/2009 | Cook et al. |
| 2009/0146892 A1 | 6/2009 | Shimizu et al. |
| 2009/0153273 A1 | 6/2009 | Chen |
| 2009/0160261 A1 | 6/2009 | Elo |
| 2009/0161078 A1 | 6/2009 | Wu et al. |
| 2009/0167449 A1 | 7/2009 | Cook et al. |
| 2009/0174263 A1 | 7/2009 | Baarman et al. |
| 2009/0179502 A1 | 7/2009 | Cook et al. |
| 2009/0188396 A1 | 7/2009 | Hofmann et al. |
| 2009/0189458 A1 | 7/2009 | Kawasaki |
| 2009/0195332 A1 | 8/2009 | Joannopoulos et al. |
| 2009/0195333 A1 | 8/2009 | Joannopoulos et al. |
| 2009/0212636 A1 | 8/2009 | Cook et al. |
| 2009/0213028 A1 | 8/2009 | Cook et al. |
| 2009/0218884 A1 | 9/2009 | Soar |
| 2009/0224608 A1 | 9/2009 | Cook et al. |
| 2009/0224609 A1 | 9/2009 | Cook et al. |
| 2009/0224723 A1 | 9/2009 | Tanabe |
| 2009/0224856 A1 | 9/2009 | Karalis et al. |
| 2009/0230777 A1 | 9/2009 | Baarman et al. |
| 2009/0237194 A1 | 9/2009 | Waffenschmidt et al. |
| 2009/0243394 A1 | 10/2009 | Levine |
| 2009/0243397 A1 | 10/2009 | Cook et al. |
| 2009/0251008 A1 | 10/2009 | Sugaya |
| 2009/0261778 A1 | 10/2009 | Kook |
| 2009/0267558 A1 | 10/2009 | Jung |
| 2009/0267709 A1 | 10/2009 | Joannopoulos et al. |
| 2009/0267710 A1 | 10/2009 | Joannopoulos et al. |
| 2009/0271047 A1 | 10/2009 | Wakamatsu |
| 2009/0271048 A1 | 10/2009 | Wakamatsu |
| 2009/0273242 A1 | 11/2009 | Cook |
| 2009/0273318 A1 | 11/2009 | Rondoni et al. |
| 2009/0281678 A1 | 11/2009 | Wakamatsu |
| 2009/0284082 A1 | 11/2009 | Mohammadian |
| 2009/0284083 A1 | 11/2009 | Karalis et al. |
| 2009/0284218 A1 | 11/2009 | Mohammadian et al. |
| 2009/0284220 A1 | 11/2009 | Toncich et al. |
| 2009/0284227 A1 | 11/2009 | Mohammadian et al. |
| 2009/0284245 A1 | 11/2009 | Kirby et al. |
| 2009/0284369 A1 | 11/2009 | Toncich et al. |
| 2009/0286470 A1 | 11/2009 | Mohammadian et al. |
| 2009/0286475 A1 | 11/2009 | Toncich et al. |
| 2009/0286476 A1 | 11/2009 | Toncich et al. |
| 2009/0289595 A1 | 11/2009 | Chen et al. |
| 2009/0299918 A1 | 12/2009 | Cook et al. |
| 2009/0308933 A1 | 12/2009 | Osada |
| 2009/0322158 A1 | 12/2009 | Stevens et al. |
| 2009/0322280 A1 | 12/2009 | Kamijo et al. |
| 2010/0015918 A1 | 1/2010 | Liu et al. |
| 2010/0017249 A1 | 1/2010 | Fincham et al. |
| 2010/0033021 A1 | 2/2010 | Bennett |
| 2010/0034238 A1 | 2/2010 | Bennett |
| 2010/0036773 A1 | 2/2010 | Bennett |
| 2010/0038970 A1 | 2/2010 | Cook et al. |
| 2010/0045114 A1 | 2/2010 | Sample et al. |
| 2010/0052431 A1 | 3/2010 | Mita |
| 2010/0052811 A1 | 3/2010 | Smith et al. |
| 2010/0060077 A1 | 3/2010 | Paulus et al. |
| 2010/0065352 A1 | 3/2010 | Ichikawa |
| 2010/0066349 A1 | 3/2010 | Lin et al. |
| 2010/0076524 A1 | 3/2010 | Forsberg et al. |
| 2010/0081379 A1 | 4/2010 | Cooper et al. |
| 2010/0094381 A1 | 4/2010 | Kim et al. |
| 2010/0096934 A1 | 4/2010 | Joannopoulos et al. |
| 2010/0102639 A1 | 4/2010 | Joannopoulos et al. |
| 2010/0102640 A1 | 4/2010 | Joannopoulos et al. |
| 2010/0102641 A1 | 4/2010 | Joannopoulos et al. |
| 2010/0104031 A1 | 4/2010 | Lacour |
| 2010/0109443 A1 | 5/2010 | Cook et al. |

(56) References Cited

U.S. PATENT DOCUMENTS

| | | |
|---|---|---|
| 2010/0109445 A1 | 5/2010 | Kurs et al. |
| 2010/0109604 A1 | 5/2010 | Boys et al. |
| 2010/0115474 A1 | 5/2010 | Takada et al. |
| 2010/0117454 A1 | 5/2010 | Cook et al. |
| 2010/0117455 A1 | 5/2010 | Joannopoulos et al. |
| 2010/0117456 A1 | 5/2010 | Karalis et al. |
| 2010/0117596 A1 | 5/2010 | Cook et al. |
| 2010/0123353 A1 | 5/2010 | Joannopoulos et al. |
| 2010/0123354 A1 | 5/2010 | Joannopoulos et al. |
| 2010/0123355 A1 | 5/2010 | Joannopoulos et al. |
| 2010/0123452 A1 | 5/2010 | Amano et al. |
| 2010/0123530 A1 | 5/2010 | Park et al. |
| 2010/0127573 A1 | 5/2010 | Joannopoulos et al. |
| 2010/0127574 A1 | 5/2010 | Joannopoulos et al. |
| 2010/0127575 A1 | 5/2010 | Joannopoulos et al. |
| 2010/0127660 A1 | 5/2010 | Cook et al. |
| 2010/0133918 A1 | 6/2010 | Joannopoulos et al. |
| 2010/0133919 A1 | 6/2010 | Joannopoulos et al. |
| 2010/0133920 A1 | 6/2010 | Joannopoulos et al. |
| 2010/0141042 A1 | 6/2010 | Kesler et al. |
| 2010/0148589 A1 | 6/2010 | Hamam et al. |
| 2010/0148723 A1 | 6/2010 | Cook et al. |
| 2010/0151808 A1 | 6/2010 | Toncich et al. |
| 2010/0156346 A1 | 6/2010 | Takada et al. |
| 2010/0156355 A1 | 6/2010 | Bauerle et al. |
| 2010/0156570 A1 | 6/2010 | Hong et al. |
| 2010/0164295 A1 | 7/2010 | Ichikawa et al. |
| 2010/0164296 A1 | 7/2010 | Kurs |
| 2010/0164297 A1 | 7/2010 | Kurs et al. |
| 2010/0164298 A1 | 7/2010 | Karalis et al. |
| 2010/0171368 A1 | 7/2010 | Schatz et al. |
| 2010/0171370 A1 | 7/2010 | Karalis et al. |
| 2010/0179384 A1 | 7/2010 | Hoeg et al. |
| 2010/0181843 A1 | 7/2010 | Schatz et al. |
| 2010/0181844 A1 | 7/2010 | Karalis et al. |
| 2010/0181845 A1 | 7/2010 | Fiorello et al. |
| 2010/0181961 A1 | 7/2010 | Novak et al. |
| 2010/0181964 A1 | 7/2010 | Huggins et al. |
| 2010/0184371 A1 | 7/2010 | Cook et al. |
| 2010/0187911 A1 | 7/2010 | Joannopoulos et al. |
| 2010/0187913 A1 | 7/2010 | Sample |
| 2010/0188183 A1 | 7/2010 | Shpiro |
| 2010/0190435 A1 | 7/2010 | Cook et al. |
| 2010/0190436 A1 | 7/2010 | Cook et al. |
| 2010/0194206 A1 | 8/2010 | Burdo et al. |
| 2010/0194207 A1 | 8/2010 | Graham |
| 2010/0194334 A1 | 8/2010 | Kirby et al. |
| 2010/0194335 A1 | 8/2010 | Kirby et al. |
| 2010/0201189 A1 | 8/2010 | Kirby et al. |
| 2010/0201201 A1 | 8/2010 | Mobarhan et al. |
| 2010/0201202 A1 | 8/2010 | Kirby et al. |
| 2010/0201203 A1 | 8/2010 | Schatz et al. |
| 2010/0201204 A1 | 8/2010 | Sakoda et al. |
| 2010/0201205 A1 | 8/2010 | Karalis et al. |
| 2010/0201310 A1 | 8/2010 | Vorenkamp et al. |
| 2010/0201312 A1 | 8/2010 | Kirby et al. |
| 2010/0201313 A1 | 8/2010 | Vorenkamp et al. |
| 2010/0201316 A1 | 8/2010 | Takada et al. |
| 2010/0201513 A1 | 8/2010 | Vorenkamp et al. |
| 2010/0207458 A1 | 8/2010 | Joannopoulos et al. |
| 2010/0210233 A1 | 8/2010 | Cook et al. |
| 2010/0213770 A1 | 8/2010 | Kikuchi |
| 2010/0213895 A1 | 8/2010 | Keating et al. |
| 2010/0217553 A1 | 8/2010 | Von Novak et al. |
| 2010/0219694 A1 | 9/2010 | Kurs et al. |
| 2010/0219695 A1 | 9/2010 | Komiyama et al. |
| 2010/0219696 A1 | 9/2010 | Kojima |
| 2010/0222010 A1 | 9/2010 | Ozaki et al. |
| 2010/0225175 A1 | 9/2010 | Karalis et al. |
| 2010/0225270 A1 | 9/2010 | Jacobs et al. |
| 2010/0225271 A1 | 9/2010 | Oyobe et al. |
| 2010/0225272 A1 | 9/2010 | Kirby et al. |
| 2010/0231053 A1 | 9/2010 | Karalis et al. |
| 2010/0231163 A1 | 9/2010 | Mashinsky |
| 2010/0231340 A1 | 9/2010 | Fiorello et al. |
| 2010/0234922 A1 | 9/2010 | Forsell |
| 2010/0235006 A1 | 9/2010 | Brown |
| 2010/0237706 A1 | 9/2010 | Karalis et al. |
| 2010/0237707 A1 | 9/2010 | Karalis et al. |
| 2010/0237708 A1 | 9/2010 | Karalis et al. |
| 2010/0237709 A1 | 9/2010 | Hall et al. |
| 2010/0244576 A1 | 9/2010 | Hillan et al. |
| 2010/0244577 A1 | 9/2010 | Shimokawa |
| 2010/0244578 A1 | 9/2010 | Yoshikawa |
| 2010/0244579 A1 | 9/2010 | Sogabe et al. |
| 2010/0244580 A1 | 9/2010 | Uchida et al. |
| 2010/0244581 A1 | 9/2010 | Uchida |
| 2010/0244582 A1 | 9/2010 | Yoshikawa |
| 2010/0244583 A1 | 9/2010 | Shimokawa |
| 2010/0244767 A1 | 9/2010 | Turner et al. |
| 2010/0244839 A1 | 9/2010 | Yoshikawa |
| 2010/0248622 A1 | 9/2010 | Kirby et al. |
| 2010/0253152 A1 | 10/2010 | Karalis et al. |
| 2010/0253281 A1 | 10/2010 | Li |
| 2010/0256481 A1 | 10/2010 | Mareci et al. |
| 2010/0256831 A1 | 10/2010 | Abram et al. |
| 2010/0259108 A1 | 10/2010 | Giler et al. |
| 2010/0259109 A1 | 10/2010 | Sato |
| 2010/0259110 A1 | 10/2010 | Kurs et al. |
| 2010/0264745 A1 | 10/2010 | Karalis et al. |
| 2010/0264746 A1 | 10/2010 | Kazama et al. |
| 2010/0264747 A1 | 10/2010 | Hall et al. |
| 2010/0271049 A1 | 10/2010 | Van Gastel et al. |
| 2010/0276995 A1 | 11/2010 | Marzetta et al. |
| 2010/0277003 A1 | 11/2010 | Von Novak et al. |
| 2010/0277004 A1 | 11/2010 | Suzuki et al. |
| 2010/0277005 A1 | 11/2010 | Karalis et al. |
| 2010/0277120 A1 | 11/2010 | Cook et al. |
| 2010/0277121 A1 | 11/2010 | Hall et al. |
| 2010/0289341 A1 | 11/2010 | Ozaki et al. |
| 2010/0289449 A1 | 11/2010 | Elo |
| 2010/0295505 A1 | 11/2010 | Jung et al. |
| 2010/0295506 A1 | 11/2010 | Ichikawa |
| 2010/0308939 A1 | 12/2010 | Kurs |
| 2010/0314946 A1 | 12/2010 | Budde et al. |
| 2010/0327660 A1 | 12/2010 | Karalis et al. |
| 2010/0327661 A1 | 12/2010 | Karalis et al. |
| 2010/0328044 A1 | 12/2010 | Waffenschmidt et al. |
| 2011/0004269 A1 | 1/2011 | Strother et al. |
| 2011/0012431 A1 | 1/2011 | Karalis et al. |
| 2011/0018361 A1 | 1/2011 | Karalis et al. |
| 2011/0025131 A1 | 2/2011 | Karalis et al. |
| 2011/0031928 A1 | 2/2011 | Soar |
| 2011/0043046 A1 | 2/2011 | Joannopoulos et al. |
| 2011/0043047 A1 | 2/2011 | Karalis et al. |
| 2011/0043048 A1 | 2/2011 | Karalis et al. |
| 2011/0043049 A1 | 2/2011 | Karalis et al. |
| 2011/0049995 A1 | 3/2011 | Hashiguchi |
| 2011/0049996 A1 | 3/2011 | Karalis et al. |
| 2011/0049998 A1 | 3/2011 | Karalis et al. |
| 2011/0074218 A1 | 3/2011 | Karalis et al. |
| 2011/0074346 A1 | 3/2011 | Hall et al. |
| 2011/0074347 A1 | 3/2011 | Karalis et al. |
| 2011/0089895 A1 | 4/2011 | Karalis et al. |
| 2011/0095618 A1 | 4/2011 | Schatz et al. |
| 2011/0115303 A1 | 5/2011 | Baarman et al. |
| 2011/0115431 A1 | 5/2011 | Dunworth et al. |
| 2011/0121920 A1 | 5/2011 | Kurs et al. |
| 2011/0128015 A1 | 6/2011 | Dorairaj et al. |
| 2011/0140544 A1 | 6/2011 | Karalis et al. |
| 2011/0148219 A1 | 6/2011 | Karalis et al. |
| 2011/0162895 A1 | 7/2011 | Karalis et al. |
| 2011/0169339 A1 | 7/2011 | Karalis et al. |
| 2011/0181122 A1 | 7/2011 | Karalis et al. |
| 2011/0193416 A1 | 8/2011 | Campanella et al. |
| 2011/0193419 A1 | 8/2011 | Karalis et al. |
| 2011/0198939 A1 | 8/2011 | Karalis et al. |
| 2011/0215086 A1 | 9/2011 | Yeh |
| 2011/0221278 A1 | 9/2011 | Karalis et al. |
| 2011/0227528 A1 | 9/2011 | Karalis et al. |
| 2011/0227530 A1 | 9/2011 | Karalis et al. |
| 2011/0241618 A1 | 10/2011 | Karalis et al. |
| 2011/0248573 A1 | 10/2011 | Kanno et al. |
| 2011/0254377 A1 | 10/2011 | Wildmer et al. |

(56) References Cited

U.S. PATENT DOCUMENTS

| | | |
|---|---|---|
| 2011/0254503 A1 | 10/2011 | Widmer et al. |
| 2011/0266878 A9 | 11/2011 | Cook et al. |
| 2011/0278943 A1 | 11/2011 | Eckhoff et al. |
| 2012/0001492 A9 | 1/2012 | Cook et al. |
| 2012/0001593 A1 | 1/2012 | DiGuardo |
| 2012/0007435 A1 | 1/2012 | Sada et al. |
| 2012/0007441 A1 | 1/2012 | John et al. |
| 2012/0025602 A1 | 2/2012 | Boys et al. |
| 2012/0032522 A1 | 2/2012 | Schatz et al. |
| 2012/0038525 A1 | 2/2012 | Monsalve Carcelen et al. |
| 2012/0062345 A1 | 3/2012 | Kurs et al. |
| 2012/0068549 A1 | 3/2012 | Karalis et al. |
| 2012/0086284 A1 | 4/2012 | Campanella et al. |
| 2012/0086867 A1 | 4/2012 | Kesler et al. |
| 2012/0091794 A1 | 4/2012 | Campanella et al. |
| 2012/0091795 A1 | 4/2012 | Fiorello et al. |
| 2012/0091796 A1 | 4/2012 | Kesler et al. |
| 2012/0091797 A1 | 4/2012 | Kesler et al. |
| 2012/0091819 A1 | 4/2012 | Kulikowski et al. |
| 2012/0091820 A1 | 4/2012 | Campanella et al. |
| 2012/0091949 A1 | 4/2012 | Campanella et al. |
| 2012/0091950 A1 | 4/2012 | Campanella et al. |
| 2012/0098350 A1 | 4/2012 | Campanella et al. |
| 2012/0112531 A1 | 5/2012 | Kesler et al. |
| 2012/0112532 A1 | 5/2012 | Kesler et al. |
| 2012/0112534 A1 | 5/2012 | Kesler et al. |
| 2012/0112535 A1 | 5/2012 | Karalis et al. |
| 2012/0112536 A1 | 5/2012 | Karalis et al. |
| 2012/0112538 A1 | 5/2012 | Kesler et al. |
| 2012/0112691 A1 | 5/2012 | Kurs et al. |
| 2012/0119569 A1 | 5/2012 | Karalis et al. |
| 2012/0119575 A1 | 5/2012 | Kurs et al. |
| 2012/0119576 A1 | 5/2012 | Kesler et al. |
| 2012/0119698 A1 | 5/2012 | Karalis et al. |
| 2012/0139355 A1 | 6/2012 | Ganem et al. |
| 2012/0146575 A1 | 6/2012 | Armstrong et al. |
| 2012/0153732 A1 | 6/2012 | Kurs et al. |
| 2012/0153733 A1 | 6/2012 | Schatz et al. |
| 2012/0153734 A1 | 6/2012 | Kurs et al. |
| 2012/0153735 A1 | 6/2012 | Karalis et al. |
| 2012/0153736 A1 | 6/2012 | Karalis et al. |
| 2012/0153737 A1 | 6/2012 | Karalis et al. |
| 2012/0153738 A1 | 6/2012 | Karalis et al. |
| 2012/0153893 A1 | 6/2012 | Schatz et al. |
| 2012/0184338 A1 | 7/2012 | Kesler et al. |
| 2012/0206096 A1 | 8/2012 | John |
| 2012/0223573 A1 | 9/2012 | Schatz et al. |
| 2012/0228952 A1 | 9/2012 | Hall et al. |
| 2012/0228953 A1 | 9/2012 | Kesler et al. |
| 2012/0228954 A1 | 9/2012 | Kesler et al. |
| 2012/0235500 A1 | 9/2012 | Ganem et al. |
| 2012/0235501 A1 | 9/2012 | Kesler et al. |
| 2012/0235502 A1 | 9/2012 | Kesler et al. |
| 2012/0235503 A1 | 9/2012 | Kesler et al. |
| 2012/0235504 A1 | 9/2012 | Kesler et al. |
| 2012/0235505 A1 | 9/2012 | Schatz et al. |
| 2012/0235566 A1 | 9/2012 | Karalis et al. |
| 2012/0235567 A1 | 9/2012 | Karalis et al. |
| 2012/0235633 A1 | 9/2012 | Kesler et al. |
| 2012/0235634 A1 | 9/2012 | Hall et al. |
| 2012/0239117 A1 | 9/2012 | Kesler et al. |
| 2012/0242159 A1 | 9/2012 | Lou et al. |
| 2012/0242225 A1 | 9/2012 | Karalis et al. |
| 2012/0248884 A1 | 10/2012 | Karalis et al. |
| 2012/0248886 A1 | 10/2012 | Kesler et al. |
| 2012/0248887 A1 | 10/2012 | Kesler et al. |
| 2012/0248888 A1 | 10/2012 | Kesler et al. |
| 2012/0248981 A1 | 10/2012 | Karalis et al. |
| 2012/0256494 A1 | 10/2012 | Kesler et al. |
| 2012/0267960 A1 | 10/2012 | Low et al. |
| 2012/0280765 A1 | 11/2012 | Kurs et al. |
| 2012/0313449 A1 | 12/2012 | Kurs et al. |
| 2012/0313742 A1 | 12/2012 | Kurs et al. |
| 2013/0007949 A1 | 1/2013 | Kurs et al. |
| 2013/0020878 A1 | 1/2013 | Karalis et al. |
| 2013/0033118 A1 | 2/2013 | Karalis et al. |
| 2013/0038402 A1 | 2/2013 | Karalis et al. |
| 2013/0057364 A1 | 3/2013 | Kesler et al. |
| 2013/0062966 A1 | 3/2013 | Verghese et al. |
| 2013/0069441 A1 | 3/2013 | Verghese et al. |
| 2013/0069753 A1 | 3/2013 | Kurs et al. |
| 2013/0088372 A1* | 4/2013 | Lundstrum ........ H03K 17/9622 341/33 |
| 2013/0099587 A1 | 4/2013 | Lou et al. |
| 2013/0154383 A1 | 6/2013 | Kasturi et al. |
| 2013/0154389 A1 | 6/2013 | Kurs et al. |
| 2013/0159956 A1 | 6/2013 | Verghese et al. |
| 2013/0175874 A1 | 7/2013 | Lou et al. |
| 2013/0175875 A1 | 7/2013 | Kurs et al. |
| 2013/0200716 A1 | 8/2013 | Kesler et al. |
| 2013/0200721 A1 | 8/2013 | Kurs et al. |
| 2013/0221744 A1 | 8/2013 | Hall et al. |
| 2013/0278073 A1 | 10/2013 | Kurs et al. |
| 2013/0278074 A1 | 10/2013 | Kurs et al. |
| 2013/0278075 A1 | 10/2013 | Kurs et al. |
| 2013/0300353 A1 | 11/2013 | Kurs et al. |
| 2013/0307349 A1 | 11/2013 | Hall et al. |
| 2013/0320773 A1 | 12/2013 | Schatz et al. |
| 2013/0334892 A1 | 12/2013 | Hall et al. |
| 2014/0002012 A1 | 1/2014 | McCauley et al. |
| 2014/0070764 A1 | 3/2014 | Keeling |

FOREIGN PATENT DOCUMENTS

| | | |
|---|---|---|
| CN | 102439669 | 5/2012 |
| CN | 103329397 | 9/2013 |
| DE | 38 24 972 | 1/1989 |
| DE | 100 29147 | 12/2001 |
| DE | 200 16 655 | 3/2002 |
| DE | 102 21 484 | 11/2003 |
| DE | 103 04 584 | 8/2004 |
| DE | 10 2005 036290 | 2/2007 |
| DE | 10 2006 044057 | 4/2008 |
| EP | 1 335 477 | 8/2003 |
| EP | 1 521 206 | 4/2005 |
| EP | 1 524 010 | 4/2005 |
| EP | 2 243 906 | 10/2010 ............ E05B 17/22 |
| EP | 2 357 716 | 8/2011 |
| JP | 02-097005 | 4/1990 |
| JP | 4-265875 | 9/1992 |
| JP | 6-341410 | 12/1994 |
| JP | 9-182323 | 7/1997 |
| JP | 9-298847 | 11/1997 |
| JP | 10-164837 | 6/1998 |
| JP | 11-75329 | 3/1999 |
| JP | 11-188113 | 7/1999 |
| JP | 2001-309580 | 11/2001 |
| JP | 2002-010535 | 1/2002 |
| JP | 2003-179526 | 6/2003 |
| JP | 2004-166459 | 6/2004 |
| JP | 2004-201458 | 7/2004 |
| JP | 2004-229144 | 8/2004 |
| JP | 2005-57444 | 3/2005 |
| JP | 2005-149238 | 6/2005 |
| JP | 2006-074848 | 3/2006 |
| JP | 2007-505480 | 3/2007 |
| JP | 2007-266892 | 10/2007 |
| JP | 2007-537637 | 12/2007 |
| JP | 2008-508842 | 3/2008 |
| JP | 2008-206231 | 9/2008 |
| JP | 2008-206327 | 9/2008 |
| JP | 2011-072074 | 4/2011 |
| JP | 2012-504387 | 2/2012 |
| JP | 2013-543718 | 12/2013 |
| KR | 10-2007-0017804 | 2/2007 |
| KR | 10-2008-0007635 | 1/2008 |
| KR | 10-2009-0122072 | 11/2009 |
| KR | 10-2011-0050920 | 5/2011 |
| SG | 112842 | 7/2005 |
| WO | WO 92/17929 | 10/1992 |
| WO | WO 93/23908 | 11/1993 |
| WO | WO 94/28560 | 12/1994 |
| WO | WO 95/11545 | 4/1995 |
| WO | WO 96/02970 | 2/1996 |

(56) References Cited

FOREIGN PATENT DOCUMENTS

| | | |
|---|---|---|
| WO | WO 98/50993 | 11/1998 |
| WO | WO 00/77910 | 12/2000 |
| WO | WO 03/092329 | 11/2003 |
| WO | WO 03/096361 | 11/2003 |
| WO | WO 03/096512 | 11/2003 |
| WO | WO 2004/015885 | 2/2004 |
| WO | WO 2004/038888 | 5/2004 |
| WO | WO 2004/055654 | 7/2004 |
| WO | WO 2004/073150 | 8/2004 |
| WO | WO 2004/073166 | 8/2004 |
| WO | WO 2004/073176 | 8/2004 |
| WO | WO 2004/073177 | 8/2004 |
| WO | WO 2004/112216 | 12/2004 |
| WO | WO 2005/024865 | 3/2005 |
| WO | WO 2005/060068 | 6/2005 |
| WO | WO 2005/109597 | 11/2005 |
| WO | WO 2005/109598 | 11/2005 |
| WO | WO 2006/011769 | 2/2006 |
| WO | WO 2007/008646 | 1/2007 |
| WO | WO 2007/020583 | 2/2007 |
| WO | WO 2007/042952 | 4/2007 |
| WO | WO 2007/084716 | 7/2007 |
| WO | WO 2007/084717 | 7/2007 |
| WO | WO 2008/109489 | 9/2008 |
| WO | WO 2008/118178 | 10/2008 |
| WO | WO 2009/009559 | 1/2009 |
| WO | WO 2009/018568 | 2/2009 |
| WO | WO 2009/023155 | 2/2009 |
| WO | WO 2009/023646 | 2/2009 |
| WO | WO 2009/033043 | 3/2009 |
| WO | WO 2009/062438 | 5/2009 |
| WO | WO 2009/070730 | 6/2009 |
| WO | WO 2009/126963 | 10/2009 |
| WO | WO 2009/140506 | 11/2009 |
| WO | WO 2009/149464 | 12/2009 |
| WO | WO 2009/155000 | 12/2009 |
| WO | WO 2010/030977 | 3/2010 |
| WO | WO 2010/036980 | 4/2010 |
| WO | WO 2010/039967 | 4/2010 |
| WO | WO 2010/090538 | 8/2010 |
| WO | WO 2010/090539 | 8/2010 |
| WO | WO 2010/093997 | 8/2010 |
| WO | WO 2010/104569 | 9/2010 |
| WO | WO 2011/061388 | 5/2011 |
| WO | WO 2011/061821 | 5/2011 |
| WO | WO 2011/062827 | 5/2011 |
| WO | WO 2011/080308 | 7/2011 ............... G01B 7/02 |
| WO | WO 2011/112795 | 9/2011 |
| WO | WO 2012/037279 | 3/2012 |
| WO | WO 2012/170278 | 12/2012 |
| WO | WO 2013/013235 | 1/2013 |
| WO | WO 2013/020138 | 2/2013 |
| WO | WO 2013/036947 | 3/2013 |
| WO | WO 2013/059441 | 4/2013 |
| WO | WO 2013/067484 | 5/2013 |
| WO | WO 2013/113017 | 8/2013 |
| WO | WO 2013/142840 | 9/2013 |
| WO | WO 2014/004843 | 1/2014 |

OTHER PUBLICATIONS

"Intel CTO Says Gap between Humans, Machines Will Close by 2050", *Intel News Release*, (See intel.com/.../20080821comp. htm?iid=S . . . ) (Printed Nov. 6, 2009).
"Physics Update, Unwired Energy", *Physics Today*, pp. 26, (Jan. 2007) (See http://arxiv.org/abs/physics/0611063.).
"In pictures: A year in technology", *BBC News*, (Dec. 28, 2007).
"Next Little Thing 2010 Electricity without wires", CNN Money (See money.cnn.com/galleries/2009/smallbusiness/0911/gallery. next_little_thing_2010.smb/) (dated Nov. 30, 2009).
Abe et al. "A Noncontact Charger Using a Resonant Converter with Parallel Capacitor of the Secondary Coil". IEEE, 36(2):444-451, Mar./Apr. 2000.

Ahmadian, M. et al., "Miniature Transmitter for Implantable Micro Systems", *Proceedings of the 25th Annual International Conference of the IEEE EMBS Cancun, Mexico*, pp. 3028-3031.(Sep. 17-21, 2003).
Aoki, T. et al., "Observation of strong coupling between one atom and a monolithic microresonator", Nature, vol. 443:671-674 (2006).
Apneseth et al. "Introducing wireless proximity switches" ABB Review Apr. 2002.
Aristeidis Karalis et al., "Efficient Wireless non-radiative mid-range energy transfer", *Annals of Physics*, vol. 323, pp. 34-48 (2008)
Baker et al., "Feedback Analysis and Design of RF Power Links for Low-Power Bionic Systems," *IEEE Transactions on Biomedical Circuits and Systems*, vol. 1(1):28-38 (Mar. 2007).
Balanis, C.A., "Antenna Theory: Analysis and Design," 3rd Edition, Sections 4.2, 4.3, 5.2, 5.3 (Wiley, New Jersey, 2005).
Berardelli, P., "Outlets Are Out", ScienceNOW Daily News, Science Now, http://sciencenow.sciencemag.org/ cgi/content/full/2006/ 1114/2, (Nov. 14, 2006) 2 pages.
Biever, C., "Evanescent coupling' could power gadgets wirelessly", NewScientistsTech.com, http://www. newscientisttech.com/article. ns?id=dn1 0575&print=true, (Nov. 15, 2006) 2 pages.
Borenstein, S., "Man tries wirelessly boosting batteries", (The Associated Press), USA Today, (Nov. 16, 2006) 1 page.
Borenstein, S., "Man tries wirelessly boosting batteries", AP Science Writer, Boston.com, (See http://www.boston.com/business/ technology/articles/2006/11/15/man_tries_wirelessly_b . . . ) (Nov. 15, 2006).
Boyle, A., "Electro-nirvana? Not so fast", MSNBC, http:/ lcosmiclog.msnbc.msn.com/_news/2007/06/08/4350760- electro-nirvana-not-so-fast, (Jun. 8, 2007) 1 page.
Budhia, M. et al., "A New IPT Magnetic Coupler for Electric Vehicle Charging Systems", IECON 2010—36th Annual Conference on IEEE Industrial Electronics Society, Glendale, AZ, pp. 2487-2492 (Nov. 7-10, 2010).
Budhia, M. et al., "Development and evaluation of single sided flux couplers for contactless electric vehicle charging", 2011 IEEE Energy Conversion Congress and Exposition (ECCE), Phoenix, AZ, pp. 614-621 (Sep. 17-22, 2011).
Budhia, M. et al.,"Development of a Single-Sided Flux Magnetic Coupler for Electric Vehicle IPT", *IEEE Transactions on Industrial Electronics*, vol. 60:318-328 (Jan. 2013).
Bulkeley, W. M., "MIT Scientists Pave the Way for Wireless Battery Charging", The Wall Street Journal (See http://online.wsj.com/ article/SB118123955549228045.html?mod=googlenews_wsj), (Jun. 8, 2007) 2 pages.
Burri et al., "Invention Description", (Feb. 5, 2008).
Cass, S., "Air Power—Wireless data connections are common—now scientists are working on wireless power", Sponsored by IEEE Spectrum, http://spectrum.ieee.org/computing/hardware/air-power, (Nov. 2006) 2 pages.
Castelvecchi, Davide, "The Power of Induction—Cutting the last cord could resonate with our increasingly gadget dependent lives", *Science News Online*, vol. 172, No. 3, Jul. 21, 2007, 6 pages.
Chang, A., "Recharging The Wireless Way—Even physicists forget to recharge their cell phones sometimes.", PC Magazine, ABC News Internet Ventures, (Dec. 12, 2006) 1 page.
Chinaview, , "Scientists light bulb with 'wireless electricity'",www. Chinaview.cn, http://news.xinhuanet.com/english/2007-06/08/content_6215681.htm,Jun. 2007,1 page.
Cooks, G., "The vision of an MIT physicist: Getting rid of pesky rechargers", Boston.com, (Dec. 11, 2006) 1 page.
Derbyshire, D., "The end of the plug? Scientists invent wireless device that beams electricity through your home", Daily Mail, http://www.dailymail.co.uk/pages/live/articles/technology/technology.html?in_article_id=4 . . . ), (Jun. 7, 2007) 3 pages.
Eisenberg, Anne, "Automatic Recharging, From a Distance", The New York Times, (see www.nytimes.com/2012/03/11/business/ built-in-wireless-chargeing-for-electronic-devices.html?_r=0) (published on Mar. 10, 2012).
Esser et al., "A New Approach to Power Supplies for Robots", IEEE, vol. 27(5):872-875, (Sep./Oct. 1991).

(56) References Cited

OTHER PUBLICATIONS

Fan, Shanhui et al., "Rate-Equation Analysis of Output Efficiency and Modulation Rate of Photomic-Crystal Light-Emitting Diodes", IEEE Journal of Quantum Electronics, vol. 36(10):1123-1130 (Oct. 2000).

Fenske et al., "Dielectric Materials at Microwave Frequencies", Applied Microwave & Wireless, pp. 92-100 (2000).

Fernandez, C. et al., "A simple dc-dc converter for the power supply of a cochlear implant", *IEEE*, pp. 1965-1970 (2003).

Ferris, David, "How Wireless Charging Will Make Life Simpler (And Greener)", Forbes (See forbes.com/sites/davidferris/2012/07/24/how-wireless-charging-will-make-life-simpler-and-greener/print/) (dated Jul. 24, 2012).

Fildes, J., "Physics Promises Wireless Power", (Science and Technology Reporter), BBC News, (Nov. 15, 2006) 3 pages.

Fildes, J., "The technology with impact 2007", BBC News, (Dec. 27, 2007) 3 pages.

Fildes, J., "Wireless energy promise powers up", BBC News, http://news.bbc.co.uk/2/hi/technology/6725955.stm, (Jun. 7, 2007) 3 pages.

Finkenzeller, Klaus, "RFID Handbook—Fundamentals and Applications in Contactless Smart Cards", Nikkan Kohgyo-sya, Kanno Taihei, first version, pp. 32-37, 253 (Aug. 21, 2001).

Finkenzeller, Klaus, "RFID Handbook (2nd Edition)", The Nikkan Kogyo Shimbun, Ltd., pp. 19, 20, 38, 39, 43, 44, 62, 63, 67, 68, 87, 88, 291, 292 (Published on May 31, 2004).

Freedman, D.H., "Power on a Chip", MIT Technology Review, (Nov. 2004).

Gary Peterson, "MIT WiTricity Not So Original After All", *Feed Line No. 9*, (See http://www.tfcbooks.com/articles/witricity.htm) printed Nov. 12, 2009.

Geyi, Wen, "A Method for the Evaluation of Small Antenna Q", IEEE Transactions on Antennas and Propagation, vol. 51(8):2124-2129 (Aug. 2003).

Hadley, F., "Goodbye Wires—MIT Team Experimentally Demonstrates Wireless Power Transfer, Potentially Useful for Power Laptops, Cell-Phones Without Cords", Massachusetts Institute of Technology, Institute for Soldier D Nanotechnologies, http://web.mit.edu/newsoffice/2007/wireless-0607.html, (Jun. 7, 2007) 3 pages.

Haus, H.A., "Waves and Fields in Optoelectronics," Chapter 7 "Coupling of Modes—Reasonators and Couplers" (Prentice-Hall, New Jersey, 1984).

Heikkinen et al., "Performance and Efficiency of Planar Rectennas for Short-Range Wireless Power Transfer at 2.45 GHz", Microwave and Optical Technology Letters, vol. 31(2):86-91, (Oct. 20, 2001).

Highfield, R., "Wireless revolution could spell end of plugs-",(Science Editor), Telegraph.co.uk, http://www. telegraph.co.uk/news/main.jhtml?xml=/news/2007/06/07/nwireless1 07.xml, (Jun. 7, 2007) 3 pages.

Hirai et al., "Integral Motor with Driver and Wireless Transmission of Power and Information for Autonomous Subspindle Drive", IEEE, vol. 15(1):13-20, (Jan. 2000).

Hirai et al., "Practical Study on Wireless Transmission of Power and Information for Autonomous Decentralized Manufacturing System", IEEE, vol. 46(2):349-359, Apr. 1999.Kurs, a. et al., "Wireless Power Transfer via Strongly Coupled Magnetic Resonances", Science vol.317, pp. 83-86 (Jul. 6, 2007).

Hirai et al., "Study on Intelligent Battery Charging Using Inductive Transmission of Power and Information", IEEE, vol. 15(2):335-345, (Mar. 2000).

Hirai et al., "Wireless Transmission of Power and Information and Information for Cableless Linear Motor Drive", IEEE, vol. 15(1):21-27, (Jan. 2000).

Hirayama, M., "Splashpower—World Leaders in Wireless Power", PowerPoint presentation, Splashpower Japan, (Sep. 3, 2007) 30 pages.

Ho, S. L. et al., "A Comparative Study Between Novel Witricity and Traditional Inductive Magnetic Coupling in Wireless Charging", IEEE Transactions on Magnetics, vol. 47(5):1522-1525 (May 2011).

Infotech Online, "Recharging gadgets without cables", infotech.indiatimes.com, (Nov. 17, 2006) 1 page.

Jackson, J. D., "Classical Electrodynamics", 3rd Edition, Wiley, New York, 1999, pp. 201-203.

Jackson, J.D., "Classical Electrodynamics," 3rd Edition, Sections 1.11, 5.5, 5.17, 6.9, 8.1, 8.8, 9.2, 9.3 (Wiley, New York, 1999).

Jacob, M. V. et al., "Lithium Tantalate—A High Peimittivity Dielectric Material for Microwave Communication Systems", *Proceedings of IEEE TENCON—Poster Papers*, pp. 1362-1366, 2003.

Karalis, Aristeidis, "Electricity Unplugged", Feature: Wireless Energy Physics World, physicsworld.com, pp. 23-25 (Feb. 2009).

Kawamura et al., "Wireless Transmission of Power and Information Through One High-Frequency Resonant AC Link Inverter for Robot Manipulator Applications", IEEE, vol. 32(3):503-508, (May/Jun. 1996).

Kurs, A. et al., "Wireless Power Transfer via Strongly Coupled Magnetic Resonances", *Science* vol. 317, pp. 83-86 (Jul. 6, 2007).

Kurs, A. et al., "Simultaneous mid-range power transfer to multiple devices", *Applied Physics Letters*, vol. 96, No. 044102 (2010).

Kurs, A. et al.,"Optimized design of a low-resistance electrical conductor for the multimegahertz range", *Applied Physics Letters*, vol. 98:172504-172504-3 (Apr. 2011).

Lamb, Gregory M. ,"Look Ma—no wires!—Electricity broadcast through the air may someday run your home",The Christian Science Monitor,http://www.csmonitor.com/2006/1116/p14s01-stct.html,Nov. 15, 2006,2 pages.

Lee, "Antenna Circuit Design for RFID Applications," Microchip Technology Inc., AN710, 50 pages (2003).

Lee, "RFID Coil Design," Microchip Technology Inc., AN678, 21 pages (1998).

Liang et al., "Silicon waveguide two-photon absorption detector at 1.5 μm wavelength for autocorrelation measurements," Applied Physics Letters, 81(7):1323-1325 (Aug. 12, 2002).

Markoff, J. ,"Intel Moves to Free Gadgets of Their Recharging Cords", The New York Times—nytimes.com, Aug. 21, 2008, 2 pages.

Mediano, A. et al. "Design of class E amplifier with nonlinear and linear shunt capacitances for any duty cycle", IEEE Trans. Microwave Theor. Tech., vol. 55, No. 3, pp. 484-492, (2007).

Microchip Technology Inc., "microID 13.56 MHz Design Guide—MCRF355/360 Reader Reference Design," 24 pages (2001).

Minkel, J R. ,"Wireless Energy Lights Bulb from Seven Feet Away—Physicists vow to cut the cord between your laptop battery and the wall socket—with just a simple loop of wire",Scientific American,http://www.scientificamerican.com/article.cfm?id=wireless-energy-lights-bulb-from-seven-feet-away,Jun. 7, 2007,1 page.

Minkel, J R. ,"Wireless Energy Transfer May Power Devices at a Distance",Scientific American,Nov. 14, 2006,1 page.

Morgan, J., "Lab report: Pull the plug for a positive charge", The Herald, Web Issue 2680, (Nov. 16, 2006) 3 pages.

Moskvitch, Katia, "Wireless charging—the future for electric cars?", BBC News Technology (See www.bbc.co.uk/news/technology-14183409) (dated Jul. 21, 2011).

O'Brien et al., "Analysis of Wireless Power Supplies for Industrial Automation Systems", IEEE, pp. 367-72 (Nov. 2-6, 2003).

O'Brien et al., "Design of Large Air-Gap Transformers for Wireless Power Supplies", IEEE, pp. 1557-1562 (Jun. 15-19, 2003).

Pendry, J. B., "A Chiral Route to Negative Refraction", Science, vol. 306:1353-1355 (2004).

Physics Today, "Unwired energy questions asked answered", Sep. 2007, pp. 16-17.

Powercast LLC. "White Paper" Powercast simply wire free, 2003.

PR News Wire, "The Big Story for CES 2007: The public debut of eCoupled Intelligent Wireless Power", Press Release, Fulton Innovation LLC, Las Vegas, NV, (Dec. 27, 2006) 3 pages.

(56) References Cited

OTHER PUBLICATIONS

Press Release, "The world's first sheet-type wireless power transmission system: Will a socket be replaced by e-wall?",Public Relations Office, School of Engineering, University of Tokyo, Japan,Dec. 12, 2006,4 pages.
PRESSTV, "Wireless power transfer possible", http://edition.presstv.ir/detail/12754.html, Jun. 11, 2007, 1 page.
Reidy, C. (Globe Staff), "MIT discovery could unplug your iPod forever", Boston.com, http://www.boston.com/ business/ticker/2007/06/mit_discovery_c.html, (Jun. 7, 2007) 3 pages.
Risen, C., "Wireless Energy", The New York Times, (Dec. 9, 2007) 1 page.
Sakamoto et al., "A Novel Circuit for Non-Contact Charging Through Electro-Magnetic Coupling", IEEE, pp. 168-174 (1992).
Scheible, G. et al., "Novel Wireless Power Supply System for Wireless Communication Devices in Industrial Automation Systems", IEEE, pp. 1358-1363, (Nov. 5-8, 2002).
Schneider, D. "A Critical Look at Wireless Power", *IEEE Spectrum*, pp. 35-39 (May 2010).
Schneider, David, "Electrons Unplugged. Wireless power at a distance is still far away", *IEEE Spectrum*, pp. 35-39 (May 2010).
Schuder, J. C. et al., "An Inductively Coupled RF System for the Transmission of 1 kW of Power Through the Skin", *IEEE Transactions on Bio-Medical Engineering*, vol. BME-18, No. 4, pp. 265-273 (Jul. 1971).
Schuder, J. C., "Powering an Artificial Heart: Birth of the Inductively Coupled-Radio Frequency System in 1960", *Artificial Organs*, vol. 26:909-915 (2002).
Schuder, J.C. et al., "Energy Transport Into the Closed Chest From a Set of Very-Large Mutually Orthogonal Coils", Communication Electronics, vol. 64:527-534 (Jan. 1963).
Schutz, J. et al., "Load Adaptive Medium Frequency Resonant Power Supply", IEEE, pp. 282-287 (Nov. 2002).
Sekitani et al. "A large-area wireless power-transmission sheet using printed organic transistors and plastic MEMS switches" www.nature.com/naturematerials. Published online Apr. 29, 2007.
Sekitani et al., "A large-area flexible wireless power transmission sheet using printed plastic MEMS switches and organic field-effect transistors", IEDM '06, International Electron Devices Meeting, (Dec. 11-13, 2006) 4 pages.
Sekiya, H. et al., "FM/PWM control scheme in class DE inverter", IEEE Trans. Circuits Syst. I, vol. 51(7) (Jul. 2004).
Senge, M., "MIT's wireless electricity for mobile phones", Vanguard, http://www.vanguardngr.com/articles/2002/features/gsm/gsm211062007.htm, (Jun. 11, 2007) 1 page.
Sensiper, S., "Electromagnetic wave propogation on helical conductors", Technical Report No. 194 (based on PhD Thesis), Massachusetts Institute of Technology, (May 16, 1951) 126 pages.
Soljacic, M. , "Wireless Non-Radiative Energy Transfer—PowerPoint presentation". Massachusetts Institute of Technology, (Oct. 6, 2005).
Soljacic, M. et al., "Wireless Energy Transfer Can Potentially Recharge Laptops Cell Phones Without Cords", (Nov. 14, 2006) 3 pages.
Soljacic, M. et al., "Photonic-crystal slow-light enhancement of nonlinear phase sensitivity", *J. Opt. Soc. Am B*, vol. 19, No. 9, pp. 2052-2059 (Sep. 2002).
Soljacic, M., "Wireless nonradiative energy transfer", *Visions of Discovery New Light on Physics, Cosmology, and Consciousness*, Cambridge University Press, New York, NY pp. 530-542 (2011).
Someya, Takao. "The world's first sheet-type wireless power transmission system". University of Tokyo, (Dec. 12, 2006).
Staelin, David H. et al., Electromagnetic Waves, Chapters 2, 3, 4, and 8, pp. 46-176 and 336-405 (Prentice Hall Upper Saddle River, New Jersey 1998).
Stark III, Joseph C., "Wireless Power Transmission Utilizing a Phased Array of Tesla Coils", Master Thesis, Massachusetts Institute of Technology (2004).
Stewart, W., "The Power to Set you Free", Science, vol. 317:55-56 (Jul. 6, 2007).
Tang, S.C. et al., "Evaluation of the Shielding Effects on Printed-Circuit-Board Transformers Using Ferrite Plates and Copper Sheets", *IEEE Transactions on Power Electronics*, vol. 17:1080-1088 (Nov. 2002).
Tesla, Nikola, "High Frequency Oscillators for Electro-Therapeutic and Other Purposes", *Proceedings of the IEEE*, vol. 87:1282-1292 (Jul. 1999).
Tesla, Nikola, "High Frequency Oscillators for Electro-Therapeutic and Other Purposes", *The Electrical Engineer*, vol. XXVI, No. 50 (Nov. 17, 1898).
Texas Instruments, "HF Antenna Design Notes—Technical Application Report," Literature No. 11-08-26-003, 47 pages (Sep. 2003).
Thomsen et al., "Ultrahigh speed all-optical demultiplexing based on two-photon absorption in a laser diode," Electronics Letters, 34(19):1871-1872 (Sep. 17, 1998).
UPM Rafsec, "Tutorial overview of inductively coupled RFID Systems," 7 pages (May 2003).
Valtchev et al. "Efficient Resonant Inductive Coupling Energy Transfer Using New Magnetic and Design Criteria". IEEE, pp. 1293-1298, 2005.
Vandevoorde et al., "Wireless energy transfer for stand-alone systems: a comparison between low and high power applicability", Sensors and Actuators, vol. 92:305-311 (2001).
Vilkomerson, David et al., "Implantable Doppler System for Self-Monitoring Vascular Grafts", *IEEE Ultrasonics Symposium*, pp. 461-465 (2004).
Villeneuve, Pierre R. et al., "Microcavities in photonic crystals: Mode symmetry, tunability, and coupling efficiency", *Physical Review B*, vol. 54:7837-7842 (Sep. 15, 1996).
Yariv, Amnon et al., "Coupled-resonator optical waveguide: a proposal and analysis", *Optics Letters*, vol. 24(11):711-713 (Jun. 1, 1999).
Yates, David C. et al., "Optimal Transmission Frequency for Ultralow-Power Short-Range Radio Links", IEEE Transactions on Circuits and Systems—1, Regular Papers, vol. 51:1405-1413 (Jul. 2004).
Yoshihiro Konishi, *Microwave Electronic Circuit Technology*, Chapter 4, pp. 145-197 (Marcel Dekker, Inc., New York, NY 1998).
Ziaie, Babak et al., "A Low-Power Miniature Transmitter Using a Low-Loss Silicon Platform for Biotelemetry", *Proceedings—19th International Conference IEEE/EMBS*, pp. 2221-2224, (Oct. 30-Nov. 2, 1997) 4 pages.
Zierhofer, Clemens M. et al., "High-Efficiency Coupling-Insensitive Transcutaneous Power and Data Transmission Via an Inductive Link", *IEEE Transactions on Biomedical Engineering*, vol. 37, No. 7, pp. 716-722 (Jul. 1990).
International Preliminary Report on Patentability for International Application No. PCT/US2015/015975, dated Aug. 25, 2016 (11 pages).
Invitation to Pay Additional Fees and Communication Relating to the Results of the Partial International Search for International Application No. PCT/US2015/015975 dated Jun. 26, 2015 (5 Pages).

\* cited by examiner

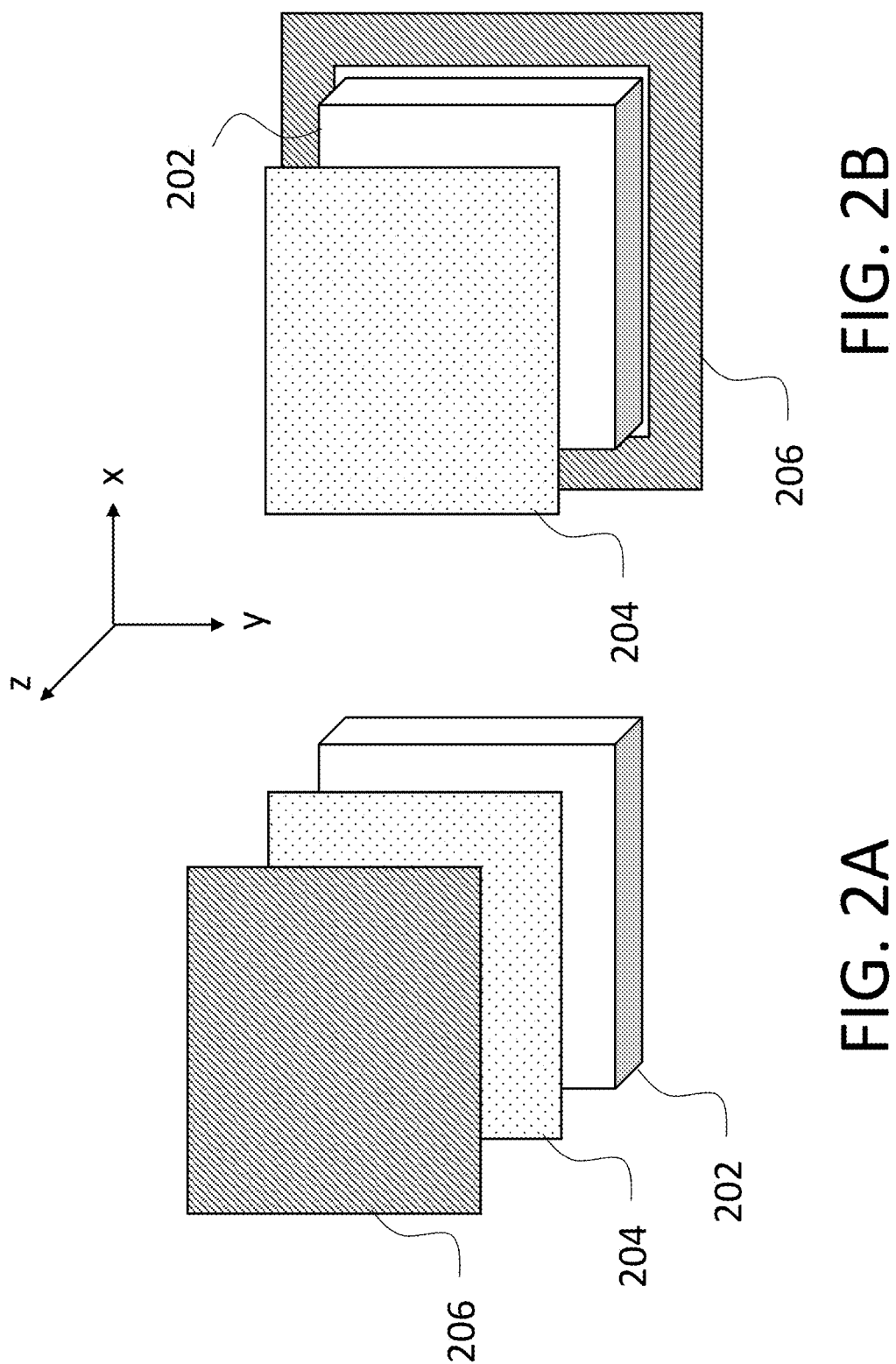

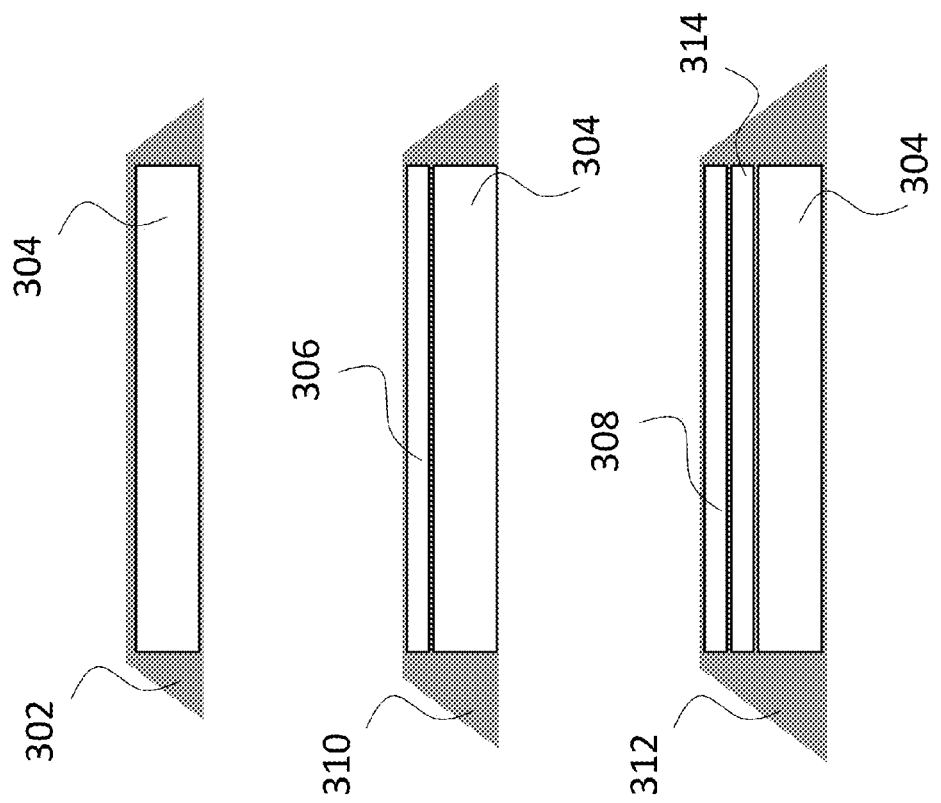

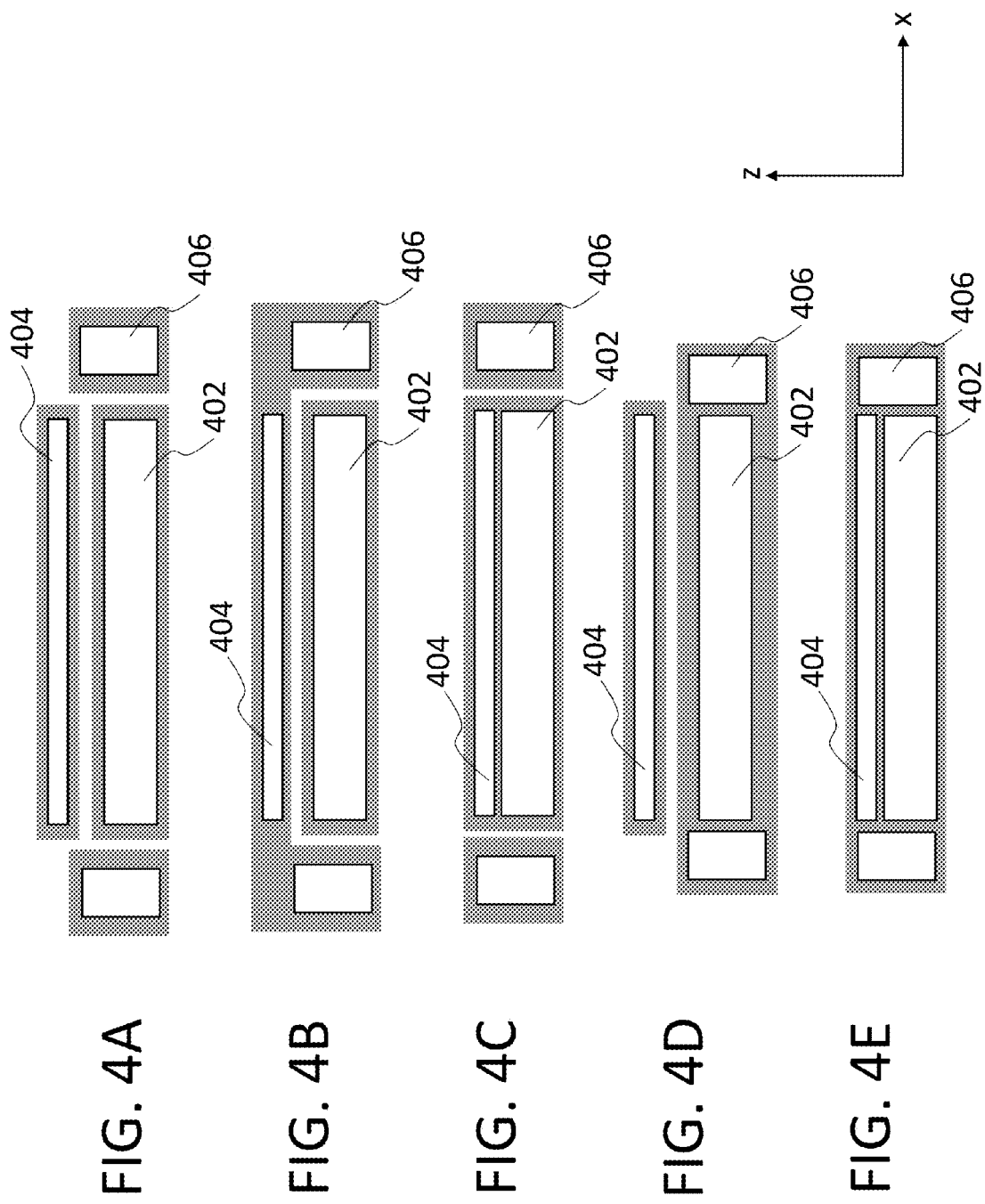

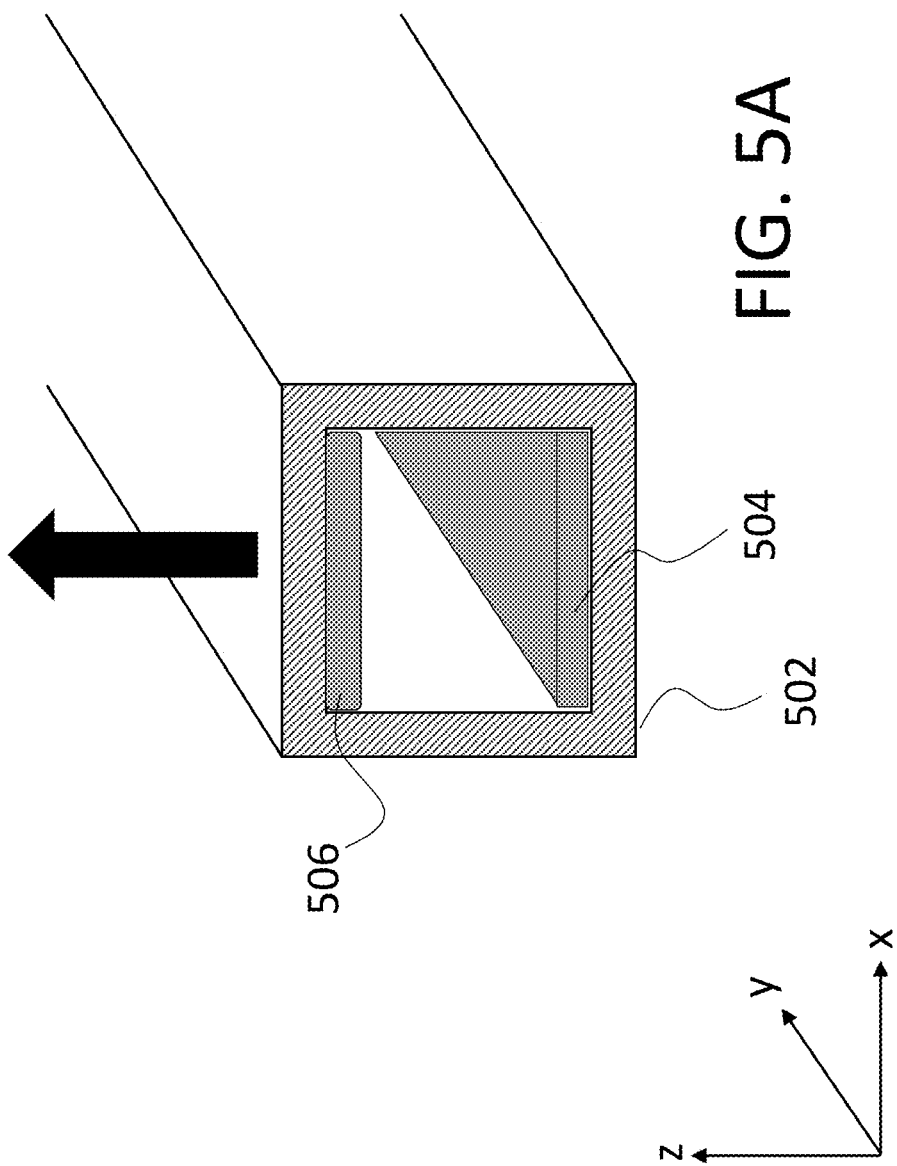

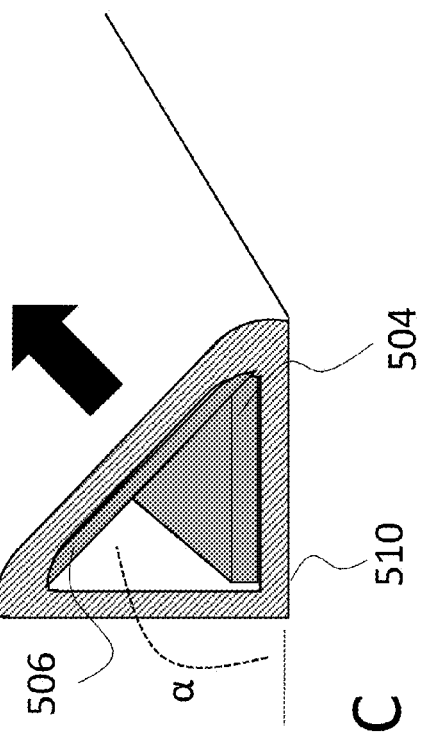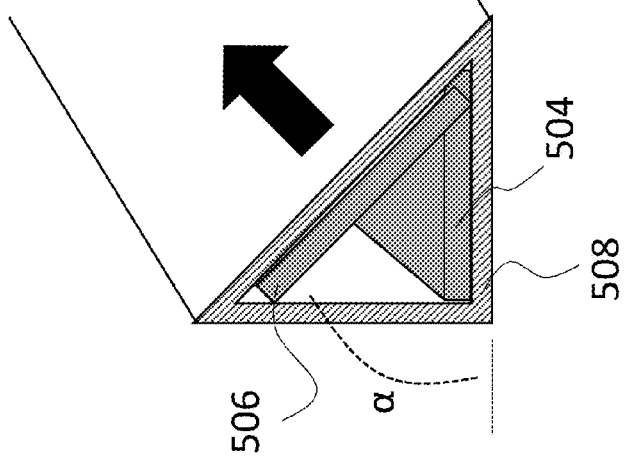

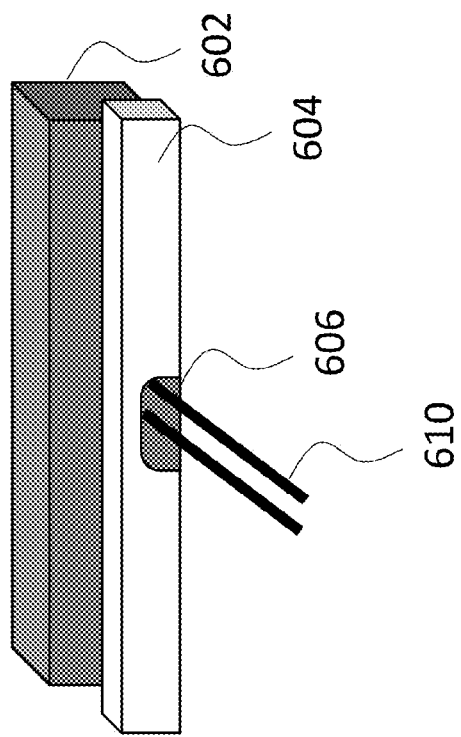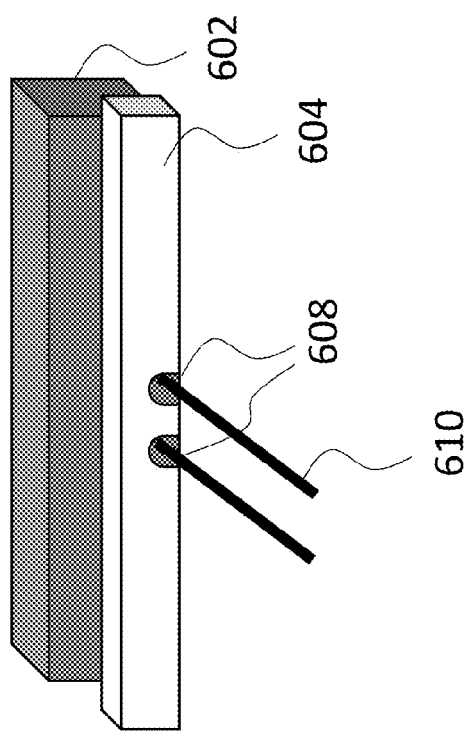

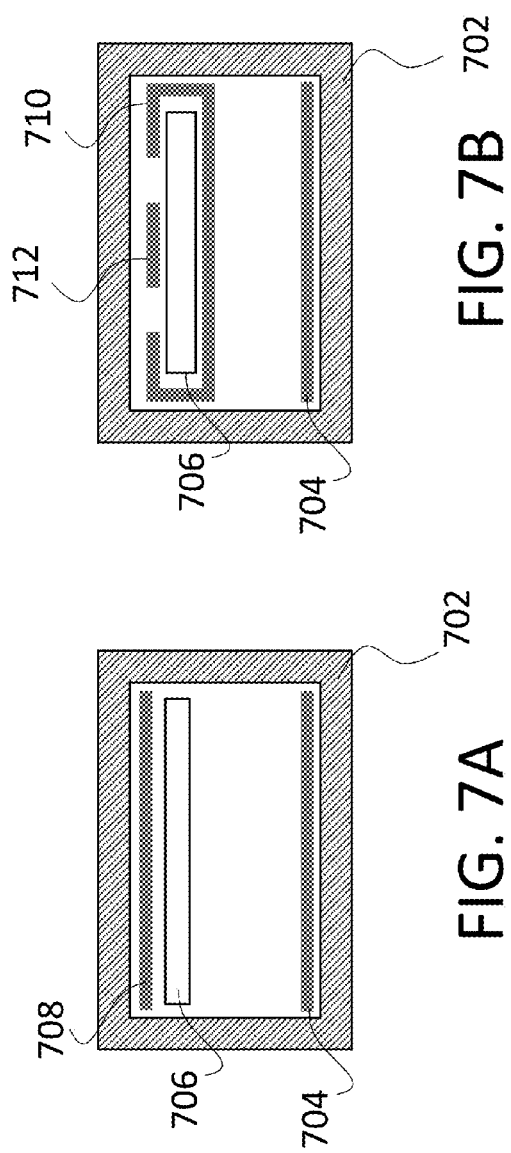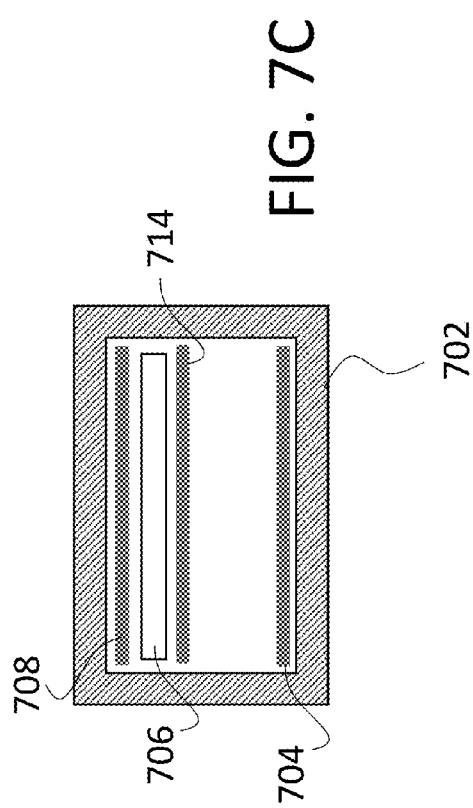

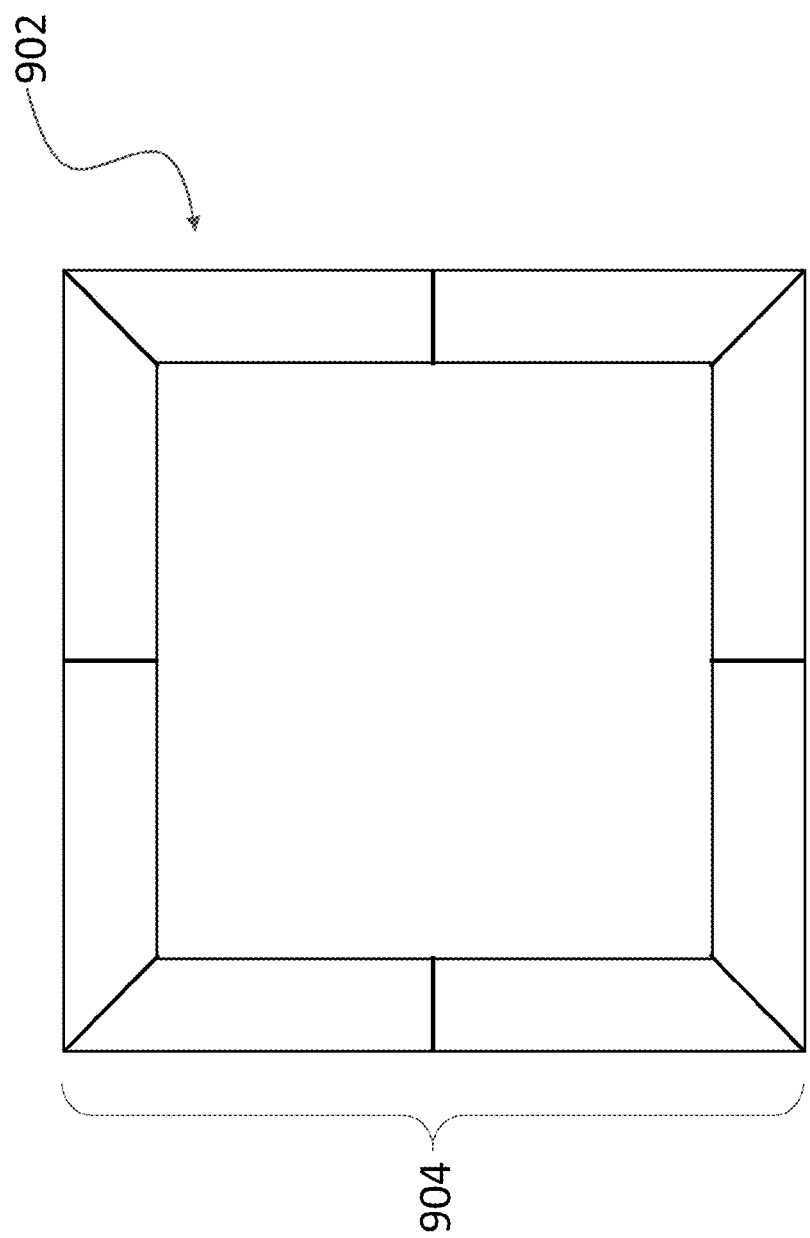

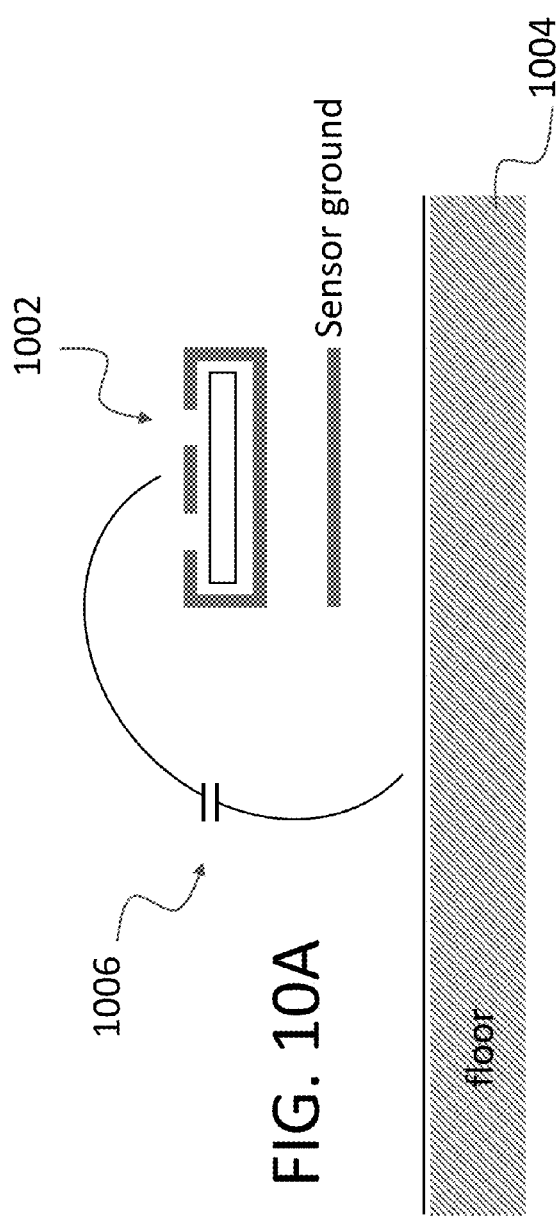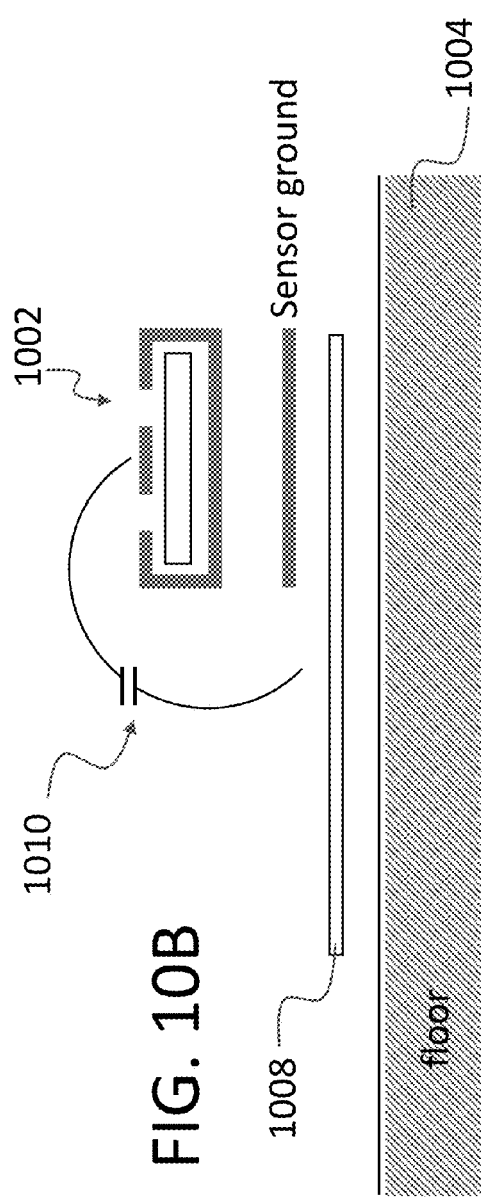

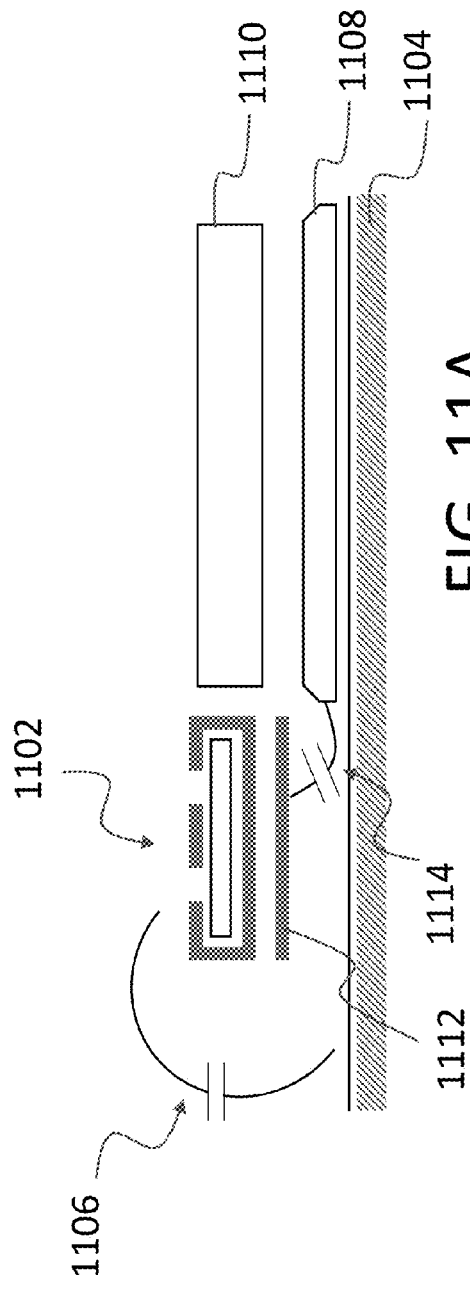
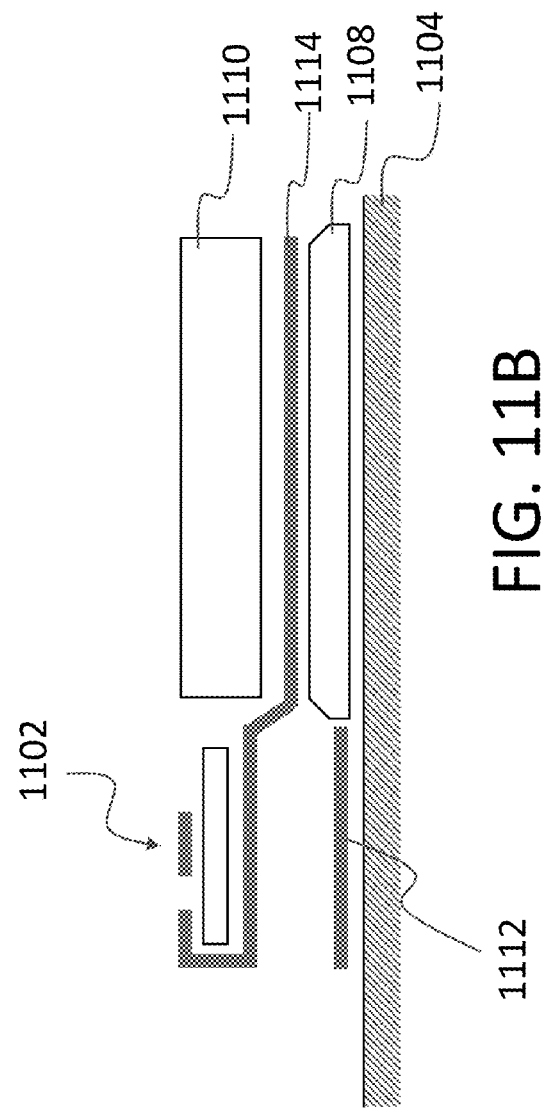

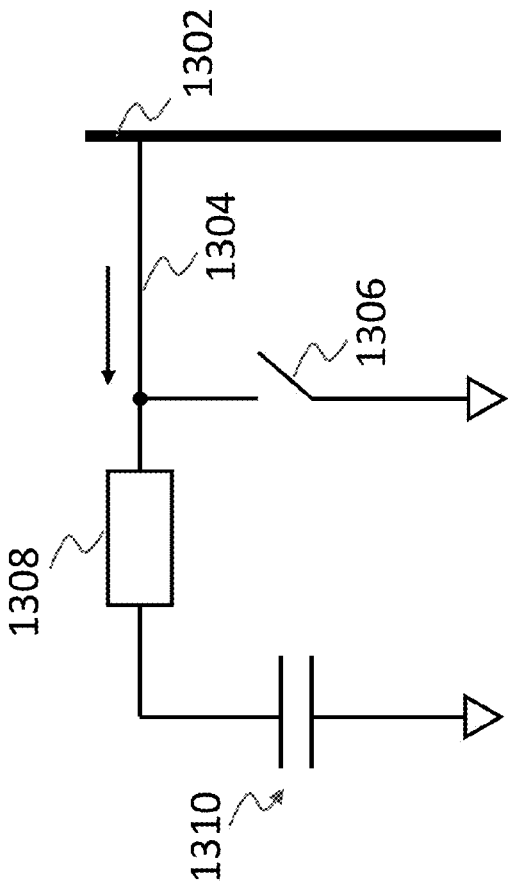
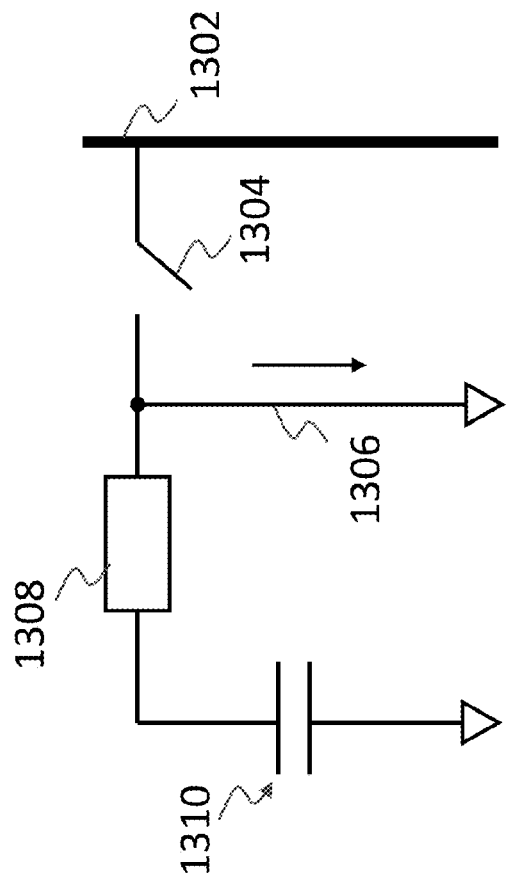
FIG. 13A
FIG. 13B

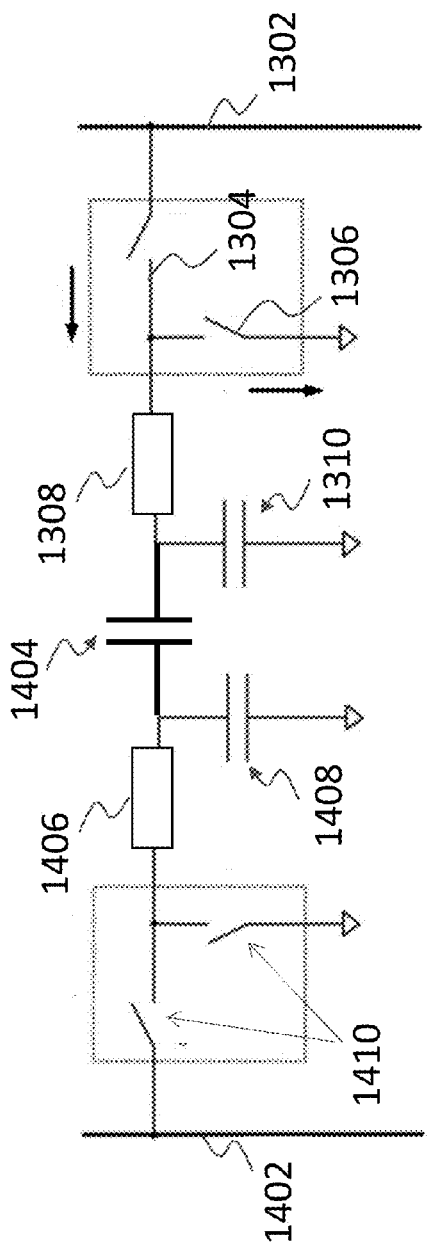
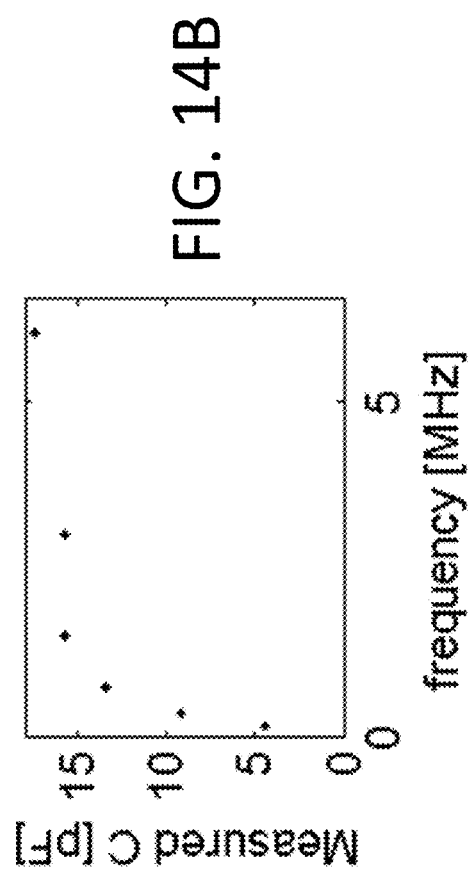
FIG. 14A
FIG. 14B

OBJECT DETECTION FOR WIRELESS ENERGY TRANSFER SYSTEMS

CROSS-REFERENCE TO RELATED APPLICATIONS

This application claims priority to U.S. Provisional Application No. 61/940,310, filed on Feb. 14, 2014, the entire contents of which are incorporated herein by reference.

BACKGROUND

This disclosure relates to foreign and living object detection in wireless energy transfer systems.

SUMMARY

In general, in a first aspect, the disclosure features living object detectors for wireless energy transfer systems, the detectors including: a first conductor, having a length $L_1$ and a width $W_1$, formed around a perimeter of an area of wireless energy transfer; a second conductor, having a length $L_2$ and a width $W_2$, formed in parallel to the first conductor; a third conductor, having a length $L_3$ and a width $W_3$, formed in parallel to the first and second conductor; and power and control circuitry connected to the conductors, where the power and control circuitry is configured to drive the first and second conductors at an equal electrical potential, and the third conductor is connected to the power and control circuitry and, during operation of the detector, forms a ground reference to the first and second conductors.

Embodiments of the detectors can include any one or more of the following features.

The detectors can be housed in a plastic enclosure. The area of wireless energy transfer can be between a wireless energy source and wireless energy device.

The second conductor can be formed as a shield under the first conductor. The second conductor can be formed as a shell with an opening, and the first conductor can be positioned within the opening. The first and/or second conductors can be formed on a printed circuit board. The detectors can be positioned at an angle with respect to a floor.

The detectors can be integrated with a wireless energy source. The wireless energy source can be configured to transfer wireless energy to a wireless energy device attached to a vehicle.

The detectors can be integrated with a foreign object detector.

Embodiments of the detectors can also include any of the other aspects or features disclosed herein, including aspects and features disclosed in connection with different embodiments, in any combination as appropriate.

In another aspect, the disclosure features enclosures for wireless energy transfer that include: a wireless energy source, featuring a resonator and power and control circuitry; a foreign object detector, featuring one or more loops of conductive material; and a living object detector, featuring conductive material, where the foreign object detector is placed on the wireless energy source, and the living object detector is formed around a perimeter of the wireless energy source.

Embodiments of the enclosures can include any of the aspects or features disclosed herein, including aspects and features disclosed in connection with different embodiments, in any combination as appropriate.

In a further aspect, the disclosure features enclosures for wireless energy transfer that include: a wireless energy device, featuring a resonator and power and control circuitry; a foreign object detector, featuring one or more loops of conductive material; and a living object detector, featuring conductive material, where the foreign object detector is placed on the wireless energy device, and the living object detector is formed around a perimeter of the wireless energy device.

Embodiments of the enclosures can include any of the aspects or features disclosed herein, including aspects and features disclosed in connection with different embodiments, in any combination as appropriate.

In another aspect, the disclosure features living object detectors for a wireless energy transfer system, the living object detectors including a sensor featuring a first conductor positioned adjacent to a first surface of a substrate, a shield featuring a second conductor different from the first conductor, where at least a portion of the second conductor is positioned proximal to the first conductor and adjacent to the first surface of the substrate, a ground reference featuring a third conductor spaced from the substrate and positioned on a side of the substrate opposite to the first surface, and an electrical circuit coupled to the first, second and third conductors and configured so that during operation of the living object detector, the electrical circuit applies a first electrical potential to the first conductor and a second electrical potential to the second conductor, the first and second electrical potentials being approximately similar, and maintains the third conductor at a ground reference electrical potential.

Embodiments of the detectors can include any one or more of the following features.

The electrical circuit can be configured so that during operation of the living object detectors, the electrical circuit measures a capacitance of the sensor, and determines whether a living object is present within a spatial region proximal to the sensor based on the measured capacitance. The first conductor can be formed on the first surface of the substrate. The first conductor can include one or more electrical traces formed on the substrate. The second conductor can be at least partially formed on the first surface of the substrate. The second conductor can be at least partially formed on multiple surfaces of the substrate. The multiple surfaces can include the first surface and a second surface of the substrate opposite the first surface. The second conductor can wrap around at least a portion of the substrate.

The second conductor can be spaced from at least one surface of the substrate. The second conductor can be spaced from a second surface of the substrate opposite the first surface. The third conductor can be positioned closer to the second surface than to the first surface.

The detectors can include an enclosure. The first, second, and third conductors can each be positioned within the enclosure. The enclosure can include at least one plastic material.

The detectors can be coupled to a wireless energy transfer system, and the spatial region can correspond to a region through which electrical energy is transferred wirelessly between a wireless energy source of the system and a wireless energy receiver.

The second conductor can surround portions of multiple surfaces of the substrate and can include an opening, and first conductor can be positioned within the opening. The second conductor can form at least a partial shell around the substrate.

The substrate can include one or more printed circuit boards. The first and second conductors can be at least partially formed on the one or more printed circuit boards. The enclosure can include a support surface configured to contact a floor surface and/or a ground surface, and at least one of the sensor and the shield can be oriented at an angle with respect to the support surface.

Wireless energy transfer systems can include any of the detectors disclosed herein, and a wireless energy source. The wireless energy source can be configured so that during operation of the system, the wireless energy source transfers energy wirelessly to a device configured to receive the energy. The wireless energy source can be configured so that during operation of the system, the wireless energy source transfers energy wirelessly to a receiver coupled to a vehicle.

Detector systems can include any of the detectors disclose herein, and a foreign object detector for a wireless energy transfer system. Detector systems can include a plurality of any of the detectors disclosed herein, where in each one of the plurality of detectors, at least one of the sensor and the shield is oriented at a different angle with respect to the support surface, and where each one of the plurality of detectors is configured to detect living objects along different spatial directions.

The detectors can include a second electrical circuit, where the first and second conductors can each be divided into two portions, first portions of the first and second conductors can be aligned, and connected to the electrical circuit, and second portions of the first and second conductors can be aligned, and connected to the second electrical circuit. The first portions of each of the first and second conductors can be L-shaped. The electrical circuit can be connected to the L-shaped first portions of each of the first and second conductors at a vertex of the L-shaped first portions. The second portions of each of the first and second conductors can be L-shaped, and the second electrical circuit can be connected to the L-shaped second portions of each of the first and second conductors at a vertex of the L-shaped second portions. The electrical circuit can be connected to the first portions of the first and second conductors at an end of the first portions, and the second electrical circuit can be connected to the second portions of the first and second conductors at an end of the second portions.

The first and second conductors can have a rectangular shape. Corners of the first and second conductors can be rounded.

The detectors can include first and second switches coupled to the electrical circuit, and the electrical circuit can be configured so that during operation of the living object detector, the electrical circuit can charge and discharge the first conductor by activating the first and second switches. The detectors can include third and fourth switches coupled to the electrical circuit, and the electrical circuit can be configured so that during operation of the living object detector, the electrical circuit can charge and discharge the second conductor by activating the third and fourth switches.

An extended portion of the second conductor can be positioned between the wireless energy source and a chassis of the wireless energy source. The electrical circuit can be configured so that during operation of the living object detector, the electrical circuit applies the first and second electrical potentials to the first and second conductors so that a parasitic capacitance between the first and second conductors is within 30% or less of a minimum value of the parasitic capacitance between the first and second conductors.

Embodiments of the detectors can also include any of the other features disclosed herein, including combinations of features disclosed in connection with different embodiments, in any combination as appropriate.

In a further aspect, the disclosure features wireless power transfer systems that include a wireless power source configured to transfer power wirelessly to a wireless power receiver by generating a resonant oscillating magnetic field, and a living object detector featuring: a sensor that includes a first conductor positioned around a perimeter of the wireless power source; a shield that includes a second conductor different from the first conductor and positioned proximal to the first conductor; and an electrical circuit coupled to the first and second conductors and configured so that during operation of the living object detector, the electrical circuit applies a first electrical potential to the first conductor and a second electrical potential to the second conductor, the first and second electrical potentials being approximately similar.

Embodiments of the systems can include any one or more of the following features.

The electrical circuit can be configured so that during operation of the living object detector, the electrical circuit determines whether a living object is present within a spatial region corresponding to the oscillating magnetic field by measuring a capacitance of the sensor. The systems can include a foreign object detector.

Embodiments of the systems can also include any of the other features disclosed herein, including combinations of features disclosed in connection with different embodiments, in any combination as appropriate.

BRIEF DESCRIPTION OF DRAWINGS

FIGS. 2A and 2B are schematic diagrams showing embodiments of wireless energy transfer systems featuring a wireless energy source, a foreign object detector, and a living object detector.

FIGS. 3A-3C are schematic diagrams showing embodiments of wireless energy transfer systems with enclosures.

FIGS. 4A-4E are schematic diagrams showing embodiments of wireless energy transfer systems with enclosures.

FIGS. 5A-5C are schematic cross-sectional diagrams showing embodiments of detectors that include an enclosure.

FIGS. 6A and 6B are schematic diagrams showing embodiments of enclosures with holes to accommodate conductors.

FIGS. 7A-7C are schematic cross-sectional diagrams of embodiments of a detector.

FIG. 9 is a schematic diagram showing an embodiment of a printed circuit board of a detector.

FIGS. 10A and 10B are schematic diagrams showing embodiments of a detector positioned in proximity to a floor of a structure.

FIGS. 11A and 11B are schematic diagrams showing embodiments of a detector positioned next to a wireless energy source or device.

FIGS. 13A and 13B are circuit diagrams showing embodiments of portions of an electrical circuit of a living object debris detector.

FIG. 14A is a circuit diagram showing an embodiment of a portion of an electrical circuit of a living object debris detector.

FIG. 14B is a plot of capacitance as a function of switching frequency for the electrical circuit of FIG. 14A.

DETAILED DESCRIPTION

I. Introduction

Figure 1:
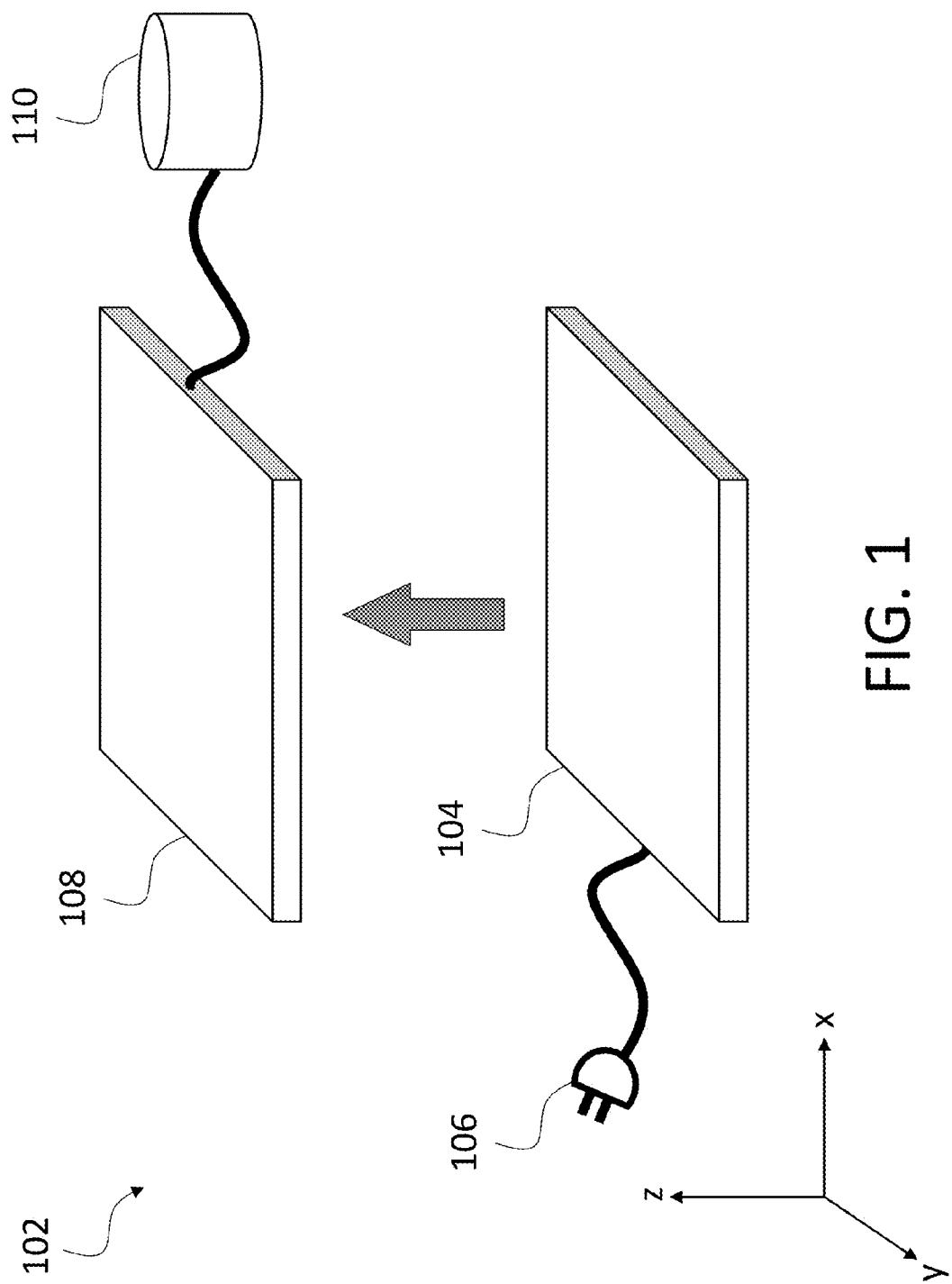
FIG. 1 is a schematic diagram showing an embodiment of a wireless energy transfer system.

Wireless power transfer systems that transfer power via an oscillating magnetic field between two coupled resonators can be efficient, non-radiative, and safe. Non-magnetic and/or non-metallic objects that are inserted between the resonators typically do not substantially interact with the magnetic field generated for wireless energy transfer. In some embodiments, however, users of wireless power transfer systems may wish to detect the presence of these "foreign objects" and may wish to control, turn down, turn off, and/or issue an alarm from, the wireless power transfer system when such objects are present in the vicinity of the systems.

On the other hand, metallic objects and certain other objects inserted between the resonators may interact with the magnetic field of the wireless power transfer system in a way that causes the metallic and/or other objects to perturb the wireless energy transfer and/or to heat up substantially. Thus, in some embodiments, when these types of strongly perturbational "foreign objects" are detected near operating wireless energy transfer systems, the users of such systems often seek to control, turn down, turn off, and issue notifications and/or alarms from, the wireless power transfer system.

Techniques for wireless power transfer, detecting the presence of foreign objects, and detecting heating of a wireless power transfer system are described, for example, in the following U.S. Patent Applications, the entire contents of each of which are incorporated by reference herein: 62/072,992, filed on Oct. 30, 2014; Ser. No. 14/059,094, filed on Oct. 21, 2013; Ser. No. 13/608,956, filed on Sep. 10, 2012; Ser. No. 12/899,281, filed on Oct. 6, 2010; and Ser. No. 12/567,716, filed on Sep. 25, 2009.

As discussed above, certain types of Foreign Object Debris (FOD) positioned in the vicinity of wireless power transfer systems are relatively benign and interact with the magnetic fields used for wireless energy transfer, if at all, in a relatively weak manner that does not significantly perturb the fields. Examples of benign FOD can include, for example, dirt, sand, leaves, twigs, snow, grease, oil, water, and a variety of other substances.

FOD can also include objects that may interact only weakly with the magnetic fields used for wireless power transfer, but which are nonetheless restricted from entering spatial regions close to the resonators of wireless transfer systems because of perceived dangers, or merely out of a preponderance of caution to avoid injury to such objects. A common example of this type of FOD is a family pet (e.g., a cat or dog) that may wish to sleep among the hardware components of the system for warmth. While unlikely, it could even be possible that human beings, particularly small children, may attempt to position themselves among components of wireless power transfer systems, where exposure to magnetic fields may exceed field exposure guidelines and regulations. Thus, in certain applications, living organisms such as humans, animals, plants, and other organic material may constitute a type of FOD. The detection of living FOD is sometimes referred to as the detection of "living object debris" (LOD).

In general, the interaction between FOD—especially metallic FOD—and the magnetic fields used for wireless power transfer may perturb the characteristics of the resonators (e.g., source and device/receiver resonators) used for wireless energy transfer, may block or reduce the magnetic fields used for energy transfer, and/or may lead to heating of the FOD, creating a fire and burning hazard. Combustible metal objects, in particular, can become hot enough to ignite during high-power wireless charging. Certain metallic objects have sufficient heat capacities such that, once heated, they can cause burns and discomfort when handled. Examples of such objects include, but are not limited to, tools, coils, metal pieces, soda cans, steel wool, food (chewing gum, burger, etc.) wrappers, and cigarette packs with metal foil wrappers.

The systems disclosed herein feature detectors to identify the presence of FOD in the vicinity of wireless power transfer systems. Certain detectors are particularly well-suited to the detection of living entities (e.g., LOD), and generate signals when such entities enter a region of space in which oscillating magnetic fields for wireless power transfer are present. As discussed above, electrical circuits that identify the presence of FOD and/or LOD can initiate a variety of responses, including issuing warning notices (e.g., alerting sounds and/or displayed messages), automatically reducing the intensities of the magnetic fields, and even halting entirely the wireless transfer of power.

In this disclosure, "wireless energy transfer" from one coil (e.g., a resonator coil of a wireless power source) to another coil (e.g., a resonator coil of a device) refers to transferring energy to do useful work (e.g., mechanical work) such as powering electronic devices, vehicles, lighting a light bulb or charging batteries. Similarly, "wireless power transfer" from one coil (e.g., resonator coil) to another resonator (e.g., another resonator coil) refers to transferring power to do useful work (e.g., mechanical work) such as powering electronic devices, vehicles, lighting a light bulb or charging batteries. Both wireless energy transfer and wireless power transfer refer to the transfer (or equivalently, the transmission) of energy to provide operating power that would otherwise be provided through a connection to a power source, such as a connection to a main voltage source.

With the above understanding, the expressions "wireless energy transfer" and "wireless power transfer" are used interchangeably in this disclosure. It is also understood that, "wireless power transfer" and "wireless energy transfer" can be accompanied by the transfer of information; that is, information can be transferred via an electromagnetic signal along with the energy or power to do useful work.

In some embodiments, a wireless power transfer system may utilize a source resonator to wirelessly transmit power to a receiver resonator. In certain embodiments, the wireless power transfer may be extended by multiple source resonators and/or multiple device resonators and/or multiple intermediate (also referred as "repeater" resonators). The resonators can be electromagnetic resonators which are capable of storing energy in electromagnetic fields (e.g., electric, magnetic fields). Any of the resonators can have a resonant frequency $f=\omega/2\pi$, an intrinsic loss rate $\Gamma$, and a Q-factor $Q=\omega/(2\Gamma)$ (also referred as "intrinsic" Q-factor in this disclosure), where $\omega$ is the angular resonant frequency. A resonator, for example, in a power source or power receiver of a wireless power transfer system, can have a capacitance and inductance that defines the resonant frequency f of the resonator.

In some embodiments, any one of a source, receiver, repeater resonator can have a Q-factor that is a high Q-factor where Q>100 (e.g., Q>100, Q>200, Q>300, Q>500, Q>1000). For example, the wireless power transfer system can include a power source having one or more source resonators, and at least one of the source resonators having a Q-factor of $Q_1$>100 (e.g., $Q_1$>100, $Q_1$>200, $Q_1$>300, $Q_1$>500, $Q_1$>1000). The wireless power transfer system can include a power receiver having one or more receiver resonators, at least one of the receiver resonators having a Q-factor of $Q_2$>100 (e.g., $Q_2$>100, $Q_2$>200, $Q_2$>300, $Q_2$>500, $Q_2$>1000). The system can include at least one receiver resonator having a Q-factor of $Q_3$>100 (e.g., $Q_3$>100, $Q_3$>200, $Q_3$>300, $Q_3$>500, $Q_3$>1000). Utilizing high Q-factor resonators can lead to large energy coupling between some or all of the resonators in the wireless power transfer system. The high Q factors can lead to strong coupling between resonators such that the "coupling time" between the resonators is shorter than the "loss time" of the resonators. In this approach, energy can be transferred efficiently between resonators at a faster rate than the energy loss rate due to losses (e.g., heating loss, radiative loss) of the resonators. In certain embodiments, a geometric mean $\sqrt{Q_iQ_j}$ can be larger than 100 (e.g., $\sqrt{Q_iQ_j}$>200, $\sqrt{Q_iQ_j}$>300, $\sqrt{Q_iQ_j}$>500, $\sqrt{Q_iQ_j}$>1000) where i and j refer to a pair of source-receiver resonator, source repeater-resonator or repeater-receiver resonators (e.g., i=1, j=2, or i=1, j=3, or i=2, j=3). Any one of the resonators can include features such as the conductors and coils that will be described in more detail in the following sections. Techniques for utilizing high-Q resonators are described, for example, in U.S. patent application Ser. No. 12/567,716, filed on Sep. 25, 2009, the entire contents of which are incorporated herein by reference.

FIG. 1 shows an example of a wireless energy transfer system 102. The wireless energy transfer system includes a wireless energy source 104 coupled to a power source 106. The wireless energy source 104 also includes one or more resonators and electronic components configured to generate a magnetic field, through which energy is wirelessly transferred to device 108. Device 108 can include one or more resonators and electronic components configured to capture and convert the energy to use in powering a load 110 or doing other useful work.

II. FOD and LOD Detectors

FIGS. 2A and 2B show examples of wireless energy transfer systems that include a wireless energy source 202, a FOD detector 204, and a LOD detector 206. In FIG. 2A, the wireless energy source 202, FOD detector 204, and LOD detector 206 are stacked on top of each other in the positive z-direction. While FIG. 2A illustrates one stacking order for these components, it should be understood that the components can be stacked in different arrangements as well.

FIG. 2B shows an example of a FOD detector 204 stacked on a wireless energy source 202 and a LOD detector 206 framing the wireless energy source 202. As shown in FIG. 2B, in some embodiments, a LOD detector may be configured to surround at least a portion of a wireless energy source by forming a frame or shell around the outer edge of the wireless energy source.

In the discussion that follows, FOD and LOD detectors are described in connection with wireless energy sources and wireless energy transfer systems. However, it should be appreciated that the FOD and LOD detectors disclosed herein can also be used with wireless energy receivers and wireless energy receiving devices and systems. The various aspects and features of the detectors discussed herein are equally applicable to detectors used in wireless energy receivers and wireless energy receiving devices and systems.

Further, it should be noted that in this disclosure, Cartesian coordinate systems are provided for descriptive purposes only, to clarify the geometrical locations and relationships between the various components described. The coordinate systems do not restrict the scope, functionality, or features of the components discussed herein.

III. Enclosures

In certain embodiments, the detectors (e.g., FOD and/or LOD detectors) disclosed herein include an enclosure. FIGS. 3A-3C are schematic diagrams showing examples of suitable enclosures. As shown in the figures, enclosure 302 can include tapered sides such that if placed on a floor of a structure (e.g., a garage, a basement, or more generally, any type of building) or on the ground, the cross-sectional shape of the enclosure reduces the risk that a human in the vicinity of the enclosure will trip over it. In some embodiments, a wireless energy source 304 can be housed in its own enclosure 302, as shown in FIG. 3A. In certain embodiments, a wireless energy source 304 and a FOD detector (or a LOD detector) 306 can be housed in a common enclosure 310 as shown in FIG. 3B. In certain embodiments, a wireless energy source 304, a FOD detector 314, and a LOD detector 308 can be housed in a common enclosure 312 as shown in FIG. 3C. As discussed above, the stacking order of the elements housed in an enclosure can vary as desired.

Enclosures can generally be fabricated from a variety of materials. For example, some or all parts of an enclosure can be formed from one or more non-conducting materials such as plastics and glass. In certain embodiments, shields formed of one or more magnetic materials and/or metals such as aluminum can be integrated into enclosures to minimize losses due to coupling by stray fields in some environments.

In some embodiments, multiple enclosures can be used to house the various components of wireless power transfer systems. FIGS. 4A-4E show schematic diagrams of various examples of enclosures for wireless energy transfer systems. As shown in the figures, an individual enclosure can enclose any one or more of a wireless energy source, a FOD detector, and a LOD detector.

In some embodiments, as shown in FIG. 4A, separate enclosures can be used for each of wireless energy transfer source 402, FOD detector 404, and LOD detector 406. Alternatively, in certain embodiments, a single enclosure can be used to house a grouping of any two of more of the wireless energy transfer source, the FOD detector, and the LOD detector. For example, FOD and LOD detectors 404 and 406 can be housed in an enclosure separate from the wireless energy source 402, as shown in FIG. 4B. As another example, an enclosure can enclose the wireless energy source 402 and the FOD detector 404 as shown in FIG. 4C, while the LOD detector 406 is housed separately. In another example, an enclosure that houses the wireless energy source 402 and the LOD detector 406 can be separate from an enclosure that houses the FOD detector 404, as shown in FIG. 4D. In yet another example, a single enclosure can house the wireless energy source 402, the FOD detector 404, and the LOD detector 406 as shown in FIG. 4E.

In some embodiments, enclosures housing FOD and/or LOD detectors can be integrated or retro-fitted to an enclosure housing a wireless energy source. For example, an enclosure housing a wireless energy source for a vehicle wireless energy transfer system can be installed in a garage floor. Post-installation, an enclosure housing LOD and/or FOD detectors can be integrated with the wireless energy source with minimal disturbance to either enclosure.

Enclosures for LOD detectors can be formed from hollow materials such as plastics that are shaped to fit around a wireless energy source or an enclosure housing a wireless energy source. FIGS. 5A-5C show schematic diagrams of various examples of enclosures. In some embodiments, the enclosure (e.g., enclosures 508, 510 in FIGS. 5B and 5C) includes a sloped surface that allows debris and water to flow away from the enclosure. In certain embodiments, the enclosure (e.g., enclosure 502 in FIG. 5A) has a cross-sectional shape that provides particularly high mechanical rigidity.

In certain embodiments, the shape of the enclosure can also impart directional sensitivity to the LOD detector. For example, referring to FIG. 5B, housing 508 includes a support surface (e.g., the bottom surface of housing 508) that is configured to rest on the floor of a structure or the ground when the housing containing the LOD sensor 506 and the wireless energy source 504 is deployed. Housing 508 includes a wall oriented at an angle α with respect to the support surface. Sensor 506 is mounted to the angled wall such that sensor 506 is also oriented at an angle α to the support surface. Orienting sensor 506 at the angle α ensures that sensor 506 preferentially detects LOD positioned along the direction indicated by the solid arrow in FIG. 5B. In some embodiments, a wireless energy transfer system can include multiple sensors 506 oriented at different angles with respect to a reference direction (e.g., the floor or ground) to preferentially detect LOD along different coordinate directions.

In some embodiments, enclosures can include curved surfaces. FIG. 5C shows an enclosure 510 with curved edges that can be useful to impart mechanical rigidity, for aesthetic design, and/or to ensure that a vehicle can readily drive over the enclosure. As shown in FIG. 5C, sensor 506 is oriented at an angle α relative to the support surface of the enclosure, as discussed above in connection with FIG. 5C.

In certain embodiments, enclosures can include holes for cables leading from a wireless energy source placed within a LOD detector. FIGS. 6A and 6B show two embodiments in which holes 606, 608 (e.g., "mouseholes") for cables that originate from a wireless energy source 602 lead through the enclosure of a LOD detector 604.

Although the foregoing discussion has focused on enclosures for use in connection with wireless energy sources, it should be appreciated that the enclosures disclosed herein can also be implemented in wireless energy receivers that are positioned on or within devices configured to receive energy. The aspects and features disclosed herein, including those already discussed above and those discussed below, are generally applicable to both wireless energy sources and wireless energy receivers.

IV. LOD Detectors

In some embodiments, a LOD detector can include a sensor, such as a capacitive sensor and/or an inductive sensor. Capacitive sensors can be formed, for example, by a conductive trace positioned in an area over, under, and/or around a region in which a living object is to be detected. In general, a LOD detector is positioned to detect living objects in a region of wireless power transfer. The area of wireless power transfer can correspond to a region of space between a wireless power source and a wireless power device. In some embodiments, the region of wireless energy transfer can be larger than the region of space circumscribed by the perimeter of the wireless power source and/or the wireless power device. In certain embodiments, the region of wireless energy transfer can be smaller than the region of space circumscribed by the perimeter of the wireless power source and/or the wireless power device.

Figure 8:
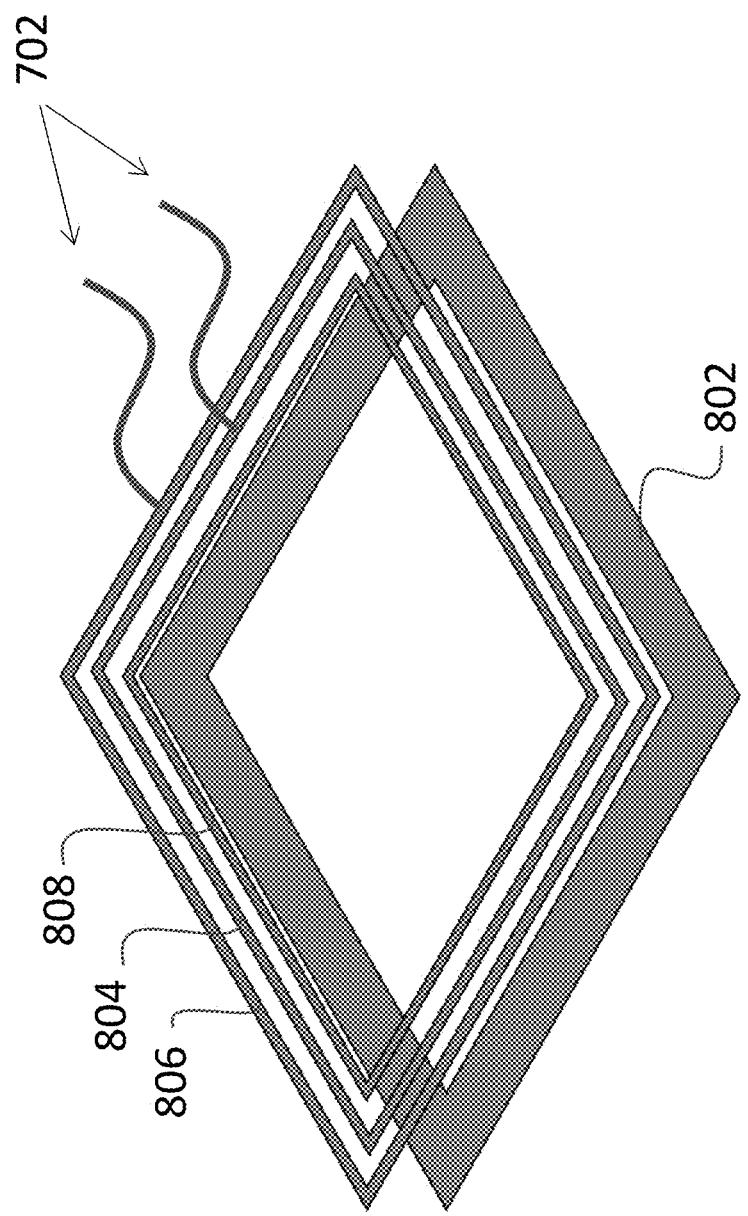
FIG. 8 is a schematic perspective view of an embodiment of conductor traces of a detector.

In certain embodiments, a LOD detector can be configured to detect living objects at the edge of, or outside, a region of wireless power transfer. FIG. 8 shows a schematic diagram of an example of a capacitive sensor 804 formed by a conductor trace that is positioned around a perimeter of a wireless energy source (not shown in FIG. 8). Concentric conductor traces 806, 808 act as a shield for sensor 804. Additional shielding traces 802 can be positioned below or to the sides of the capacitive sensor trace 804 to provide shielding from lossy elements in the environment, or to function as an electrical reference or ground.

In general, LOD detectors include a sensor, at least one shield, and optionally, a ground reference, implemented as conductors. Each of these conductors can be formed of a conductive material such as copper and/or aluminum. These conductors can be configured positioned parallel to one another or, more generally, beside, alongside, proximate, or adjacent to, but not touching, one another. FIG. 7A shows a LOD detector that includes a sensor 708 formed on a substrate 706, and a ground reference 704.

In some embodiments, it can be advantageous to include a shield for the LOD sensor. For example, shields can impart directionality to the LOD sensor, such as when the conductors that form the sensor and the one or more shields are proximal to one another on a common side of a substrate. In FIG. 7B, shield 710 wraps around substrate 706 to form a shell. Sensor 712 and a portion of shield 710 are each positioned adjacent to the same surface of substrate 706. Sensor 712 and/or shield 710 can be formed on substrate 706 or, alternatively, one or both can be spaced from substrate 706. Substrate 706 typically corresponds to one or more printed circuit boards, for example.

Shield 710 includes an aperture or hole in which sensor 712 is positioned in FIG. 7B. This configuration imparts directional sensitivity to sensor 712, relative to sensor 708 in FIG. 7A. That is, sensor 712 preferentially detects LOD along a direction orthogonal to the surface of substrate 706 (and orthogonal to sensor 712). A sensor with greater vertical directionality may have improved ability to detect living objects moving above the sensor. FIG. 7C shows a simpler version of a shield 714 that is positioned on an opposite side of substrate 706 from sensor 708, and between substrate 706 and ground reference 704.

The ground reference in the LOD detector allows the LOD detector to work independently of the environment in which it is placed. For example, if a LOD detector is placed on a metallic surface without a ground reference, there may be an increase in parasitic capacitance. By providing a ground reference to the sensor, the parasitic capacitances are controlled and kept within an expected range.

In certain embodiments, a LOD detector can detect living objects at distances of greater than 1 inch (e.g., greater than 5 inches, greater than 10 inches, greater than 20 inches). In general, the dimensions of a LOD detector can be tailored for the dimensions of a wireless power transfer application.

For example, a LOD detector can be larger than the wireless energy source or device of a vehicle wireless energy transfer system.

The example LOD detector shown in FIG. 8 can be placed or formed on a substrate, such as printed circuit board (PCB), wood, and/or plastic. In some embodiments, the substrate can be formed by multiple material sections. For example, FIG. 9 shows an embodiment of a PCB 902 that is split up into multiple pieces (e.g. eight, as shown) to mitigate the costs of manufacturing large PCBs. In some embodiments, a PCB for a single side 904 can be designed and replicated four times to create the "picture-frame" structure shown in FIG. 9.

In some embodiments, a desirable signal-to-noise ratio (SNR) for LOD sensing may be greater than or equal to 3 (e.g., greater than or equal to 5, greater than or equal to 7, greater than or equal to 10, or more). To improve SNR, LOD detectors can include shielding to minimize parasitic capacitance forming with the floor of a structure or the ground. FIG. 10A illustrates the formation of a parasitic capacitance 1006 between the sensor 1002 and the floor 1004.

In FIG. 10B, an additional shield 1008 is introduced to reduce the parasitic capacitance. In other words, the parasitic capacitance may be reduced such that capacitance 1010 is less than capacitance 1006. However, in some embodiments, if the LOD detector is placed closer to the floor or ground, there may be an increase in parasitic capacitance.

FIGS. 11A and 11B show examples of LOD detectors with different shielding configurations. FIG. 11A shows a LOD detector that includes a sensor 1102 and a shield 1112 as well as a ground conductor 1114 positioned adjacent to the chassis 1108 of the wireless energy source 1110. The chassis 1108 may be made of a metallic or lossy material such as aluminum. This may result in high parasitic capacitances between the ground 1114 and the chassis 1108 but may be considered to be an efficient way to retro-fit an existing wireless energy source with a LOD system. A parasitic capacitance 1106 is formed between sensor 1102 and floor FIG. 11B shows a LOD detector that includes a shield 1114, where an extended portion of the shield is positioned and integrated between the wireless energy source 1110 and the chassis 1108 such that the parasitic capacitance due to the chassis is reduced or even minimized.

In some embodiments, a LOD detector may be controlled by an electronic circuit (e.g., an integrated circuit (IC)) such as a programmable system-on-a-chip (PSoC). A PSoC (such as from Cypress Semiconductor Corporation, San Jose, Calif.) can include one or more microcontrollers, microprocessors, memory, timers, interfaces, voltage regulators, and/or power managers. The placement of the connection between the PSoC and the sensor in a LOD detector may influence the quality of the signal for the detection of living objects. For example, the length of a sensor as well as resistance may be a factor in how quickly the sensor and the shield charge. Accordingly, adjusting the placement of the connection point between the PSoC and the sensor along the length of the sensor and shield can mitigate charging and signal issues.

Figure 12B:
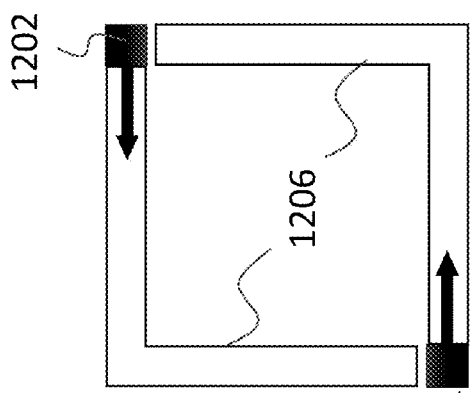
FIGS. 12A-12D are schematic diagrams showing embodiments of living object debris detectors.
Figure 12D:
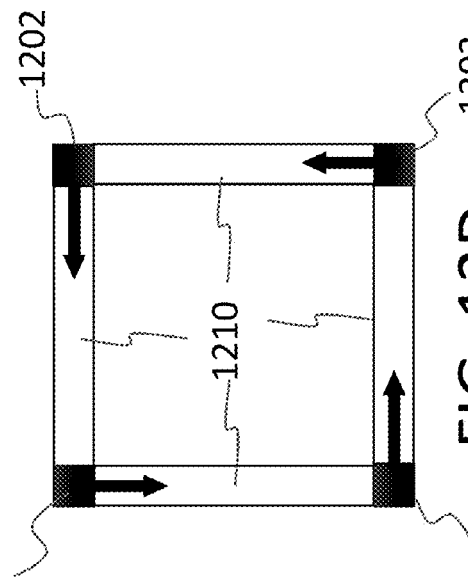
Figure 12A:
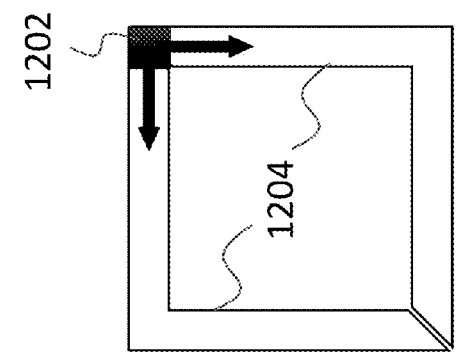

FIGS. 12A-12D show different configurations of the position of connection between PSoC 1202 and the sensor and shield of a LOD detector. FIG. 12A shows one PSoC 1202 connected and configured to control two segments of a capacitive LOD sensor. The PSoC 1202 connection is positioned such that it divides the LOD sensor 1204 into two L-shaped segments and can connect to each segment with minimal parasitic capacitance.

FIG. 12B shows two PSoCs 1202 positioned and configured to control two separate portions of a capacitive sensor 1206. In this embodiment, each PSoC 1202 is connected at the end of an L-shaped segment.

Figure 12C:
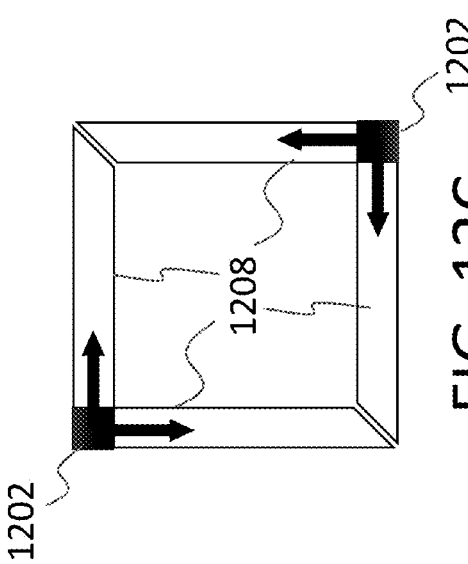

FIG. 12C shows two PSoCs 1202 positioned and configured to control two separate portions of a capacitive sensor 1208. In this embodiment, each PSoC 1202 is connected in the middle of an L-shaped segment.

FIG. 12D shows four PSoCs 1202 positioned and configured to control four segments of a capacitive sensor 1210. Each PSoC is connected at an end of one of the segments.

In some embodiments, the arrangement shown in FIG. 12C can be advantageous because the time interval during which sensor 1208 is charged is reduced. In other words, because the PSoCs are evenly spaced between the ends of the segments, they can drive both ends of the segment in a more uniform way than the configuration shown in FIG. 12B.

A challenge in charging the capacitive sensor configuration shown in FIG. 8 is that, in some embodiments, the shield can charge faster than the sensor. For example, if the product of the shield's resistance and capacitance is smaller than that of the sensor, a voltage may develop between the sensor and shield traces charging the "mutual capacitance" between the traces. If the mutual capacitance $C_{mutual}$ that exists between the sensor and shield is charged, the voltage at $C_{sensor}$ may be less than expected while the voltage at $C_{shield}$ may be greater. This may result in an overall decrease in the SNR of the LOD detector.

FIGS. 13A-13B show portions of electrical circuits connected to a capacitive sensor of a LOD detector as it is charging (FIG. 13A) and discharging (FIG. 13B). To charge the sensor, the electrical circuit closes switch 1304 and opens switch 1306, allowing current from the bus 1302 to charge $C_{sensor}$ 1310. The electrical circuit discharges $C_{sensor}$ 1310 by closing switch 1306 and opening switch 1304.

FIG. 14A shows a portion of an electrical circuit connected to a capacitive sensor of a LOD detector. The shield is represented by resistance $R_{shield}$ 1406 and capacitance $C_{shield}$ 1408, while the sensor is represented by resistance $R_{sensor}$ 1308 and capacitance $C_{sensor}$ 1310. Mutual capacitance 1404 can also depend on the switching frequency of the switches shown in FIG. 14A.

FIG. 14B is a plot of the mutual capacitance as a function of switching frequency. The plot shows that as the switching frequency is increased, the mutual capacitance 1404 is also increased. In some embodiments, mutual capacitance 1404 may be on the order of 1 nF or greater while $C_{sensor}$ and $C_{shield}$ may be much less, for example approximately 5 pF and 15 pF respectively. In some embodiments, $C_{sensor}$ may be as low as 5 pF, 10 pF, 15 pF, 20 pF, 30 pF, or greater. In certain embodiments, the capacitance of the shield $C_{shield}$ may be greater than $C_{sensor}$ and may have values of approximately 10 pF, 20 pF, 30 pF, 50 pF, or more. In exemplary embodiments, a living object can be detected when the power and control circuitry, such as the PSoC mentioned above, detects an increase in capacitance over the baseline capacitance of the sensor.

In some embodiments, the switching frequency $f_{switching}$ can have the following relationship with respect to the sensor (resistance $R_{sensor}$ and capacitance $C_{sensor}$) and to the shield (resistance $R_{shield}$ 1406 and capacitance $C_{shield}$):

$$f_{switching} \leq 1/10 R_{sensor} C_{sensor}$$

$$f_{switching} \leq 1/10 R_{shield} C_{shield}.$$

In certain embodiments, to ensure that the shield is at approximately the same potential as the sensor, the sensor and shield are configured such that the following relationship holds:

$$R_{shield}C_{shield} \cong R_{sensor}C_{sensor}.$$

In certain embodiments, the shield should be close in potential to the sensor such that the parasitic capacitance is not too large, or even minimized. In some embodiments, the parasitic capacitance is at or near its minimum when $f_{switching}$ is slower than the inverse of slowest charging time. The charging time is defined by the RC constant of the shield or the sensor. In certain embodiments, the charging time that is slower of the two charging times (for the sensor or the shield) may be that of the shield, due to a greater amount of material required to create the shield. In some embodiments, an acceptable parasitic capacitance is within 30% or less (e.g., within 20% or less, within 10% or less) of the minimum achievable parasitic capacitance. Thus, if there is too much of a difference between the potentials of the shield and sensor, there is an increase in parasitic capacitance and a decrease in SNR. The difference in potentials may be either a positive or negative difference. In other words, parasitic capacitance may increase if the shield potential is greater than the sensor potential or vice versa.

Accordingly, in some embodiments, the electrical circuit is configured to apply potentials to the sensor and shield that are approximately similar. In the context of this disclosure, "approximately similar" potentials applied to the sensor and shield are potentials that result in a parasitic capacitance between the sensor and shield that is within 30% or less of a minimum parasitic capacitance between the sensor and shield.

In some embodiments, the capacitive LOD sensor may be shaped such that the corners are rounded rather than squared at 90 degree angles. This can reduce the electric fields that result at the corners of shaped conductors as shown in FIG. 8. In certain embodiments, the SNR of LOD detection can be increased by reducing or minimizing the electric fields at the corners of the sensor.

In some embodiments, the overall height or distance away from a floor can increase the SNR. The floor on which the LOD detector is placed may be of a lossy nature such that it creates a parasitic capacitance with the sensor. For example, the floor may include a metallic material or be reinforced with structural steel (i.e., "re-bar"). In some embodiments, a metal floor has been found to decrease the SNR by twofold. A continuous shield placed under the combination of a wireless energy source, FOD detector and LOD detector can be used to reduce or even minimize the effect of capacitive coupling between the sensor and the floor.

Figure 15:
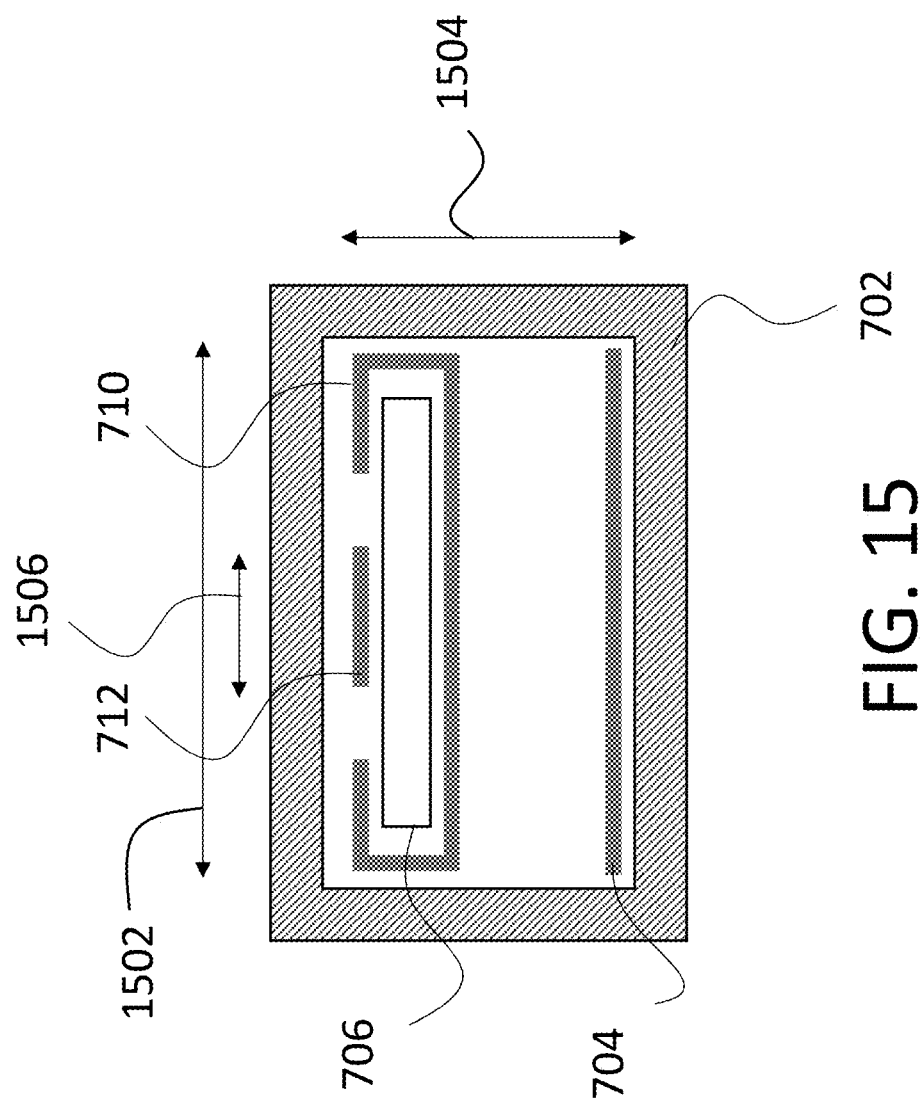
FIG. 15 is a schematic cross-sectional diagram showing an embodiment of a detector.

FIG. 15 shows another example of a LOD detector. In some embodiments, the total width 1502 may be equal to or greater than 1 inch (e.g., equal to or greater than 1.5 inches, equal to or greater than 2 inches, or more).

In certain embodiments, the sensor width 1506 may be equal to or greater than 0.25 inches (e.g., equal to or greater than 0.5 inches, equal to or greater than 0.75 inches, equal to or greater than 1 inch, equal to or greater than 1.25 inches, equal to or greater than 1.5 inches, or more).

In some embodiments, the height 1504 of sensor in relation to the ground may be equal to or greater than 0.5 inches (e.g., equal to or greater than 1 inch, equal to or greater than 1.5 inches, equal to or greater than 1.75 inches, equal to or greater than 2 inches, or more). In an exemplary embodiment, the width of the sensor 1506 is 0.75 inches, the total width 1502 is 1.5 inches, and the height 1504 is 1.75 inches.

In certain embodiments, if the width of the sensor is too wide, the range of detection decreases. This may be due to the electric fields that "wrap" around to the ground. If the width of the sensor is too small, the sensor signal is too small, leading to a low SNR. In some embodiments, if the height of the sensor from the ground is too large, the signal is increasingly noisy. Conversely, if the height of the sensor is too small (i.e., the sensor is too close to the ground), there may be large parasitic capacitances, leading to a decreased SNR.

V. Detecting LOD

LOD in proximity to the LOD sensors disclosed herein changes the electrical properties of the sensors. Electrical properties that can change include, but are not limited to, the capacitance, the inductance, and the resistance of the sensors. In particular, changes in capacitance due to the presence of LOD in the vicinity of a sensor can be measured to detect the LOD.

Typically, measurement of LOD involves comparing a measured electrical property of a sensor, such as its capacitance, to a baseline value for the electrical property. The baseline value is measured as part of a calibration procedure, when it is known that no LOD is present in the vicinity of the sensor. The baseline value (e.g., the baseline capacitance) is measured by the electrical circuit connected to the LOD sensor, and stored as calibration information.

During operation of the LOD detector, the electrical circuit makes periodic measurements of the capacitance of the LOD sensor, and compares the measured capacitance to the stored baseline value. If the change in the measured capacitance value relative to the baseline value is sufficiently large, the electrical circuit determines that LOD is present in the vicinity of the LOD sensor. The calibration information can include, stored with the baseline capacitance values, threshold values used by the electrical circuit to determine when the change in capacitance is sufficiently large to indicate a high probability that LOD is present.

Various additional aspects and steps associated with detection of LOD are disclosed, for example, in U.S. patent application Ser. No. 14/059,094, filed on Oct. 21, 2013, the entire contents of which are incorporated by reference herein.

VI. Hardware and Software Implementations

Any of the steps and functions disclosed herein can be executed by one or more electrical circuits and/or electronic processors (such as computers or preprogrammed integrated circuits) executing programs based on standard programming techniques. Such programs are designed to execute on programmable computing apparatus or specifically designed integrated circuits, each optionally comprising a processor, a data storage system (including memory and/or storage elements), at least one input device, and at least one output device, such as a display or printer. The program code is applied to input data to perform functions and generate output information which is applied to one or more output devices. Each such computer program can be implemented in a high-level procedural or object-oriented programming language, or an assembly or machine language. Furthermore, the language can be a compiled or interpreted language. Each such computer program can be stored on a computer readable storage medium (e.g., optical storage medium such as CD-ROM or DVD, magnetic storage medium, and/or persistent solid state storage medium) that, when read by a computer, processor, or electronic circuit, can cause the computer, processor, or electronic circuit to perform the functions described herein.

OTHER EMBODIMENTS

A number of embodiments have been described. Nevertheless, it will be understood that various modifications may be made without departing from the spirit and scope of the disclosure. Accordingly, other embodiments are within the scope of the following claims.

What is claimed is:

1. A living object detector for a wireless energy transfer system, comprising:
   a sensor comprising a first conductor positioned adjacent to a first surface of a substrate;
   a shield comprising a second conductor different from the first conductor, wherein at least a portion of the second conductor is positioned proximal to the first conductor and adjacent to the first surface of the substrate;
   a ground reference comprising a third conductor spaced from the substrate and positioned on a side of the substrate opposite to the first surface, wherein during operation of the living object detector, the third conductor is maintained at a ground reference electrical potential;
   first and second switches; and
   an electrical circuit coupled to the first, second and third conductors and to the first and second switches, and configured so that during the operation of the living object detector:
      the electrical circuit applies a first electrical potential to the first conductor and a second electrical potential to the second conductor, the first and second electrical potentials being approximately similar; and
      the electrical circuit can charge and discharge the first conductor by activating the first and second switches.

2. The detector of claim 1, comprising third and fourth switches coupled to the electrical circuit, wherein the electrical circuit is configured so that during the operation of the living object detector, the electrical circuit can charge and discharge the second conductor by activating the third and fourth switches.

3. The detector of claim 1, wherein the electrical circuit is configured so that during the operation of the detector, the electrical circuit:
   measures a capacitance of the sensor; and
   determines whether a living object is present within a spatial region proximal to the sensor based on the measured capacitance.

4. The detector of claim 1, wherein:
   the first conductor comprises one or more electrical traces formed on the first surface of the substrate; and
   the second conductor is at least partially formed on multiple surfaces of the substrate,
   wherein the multiple surfaces comprise the first surface and a second surface of the substrate opposite the first surface.

5. The detector of claim 4, wherein the second conductor wraps around at least a portion of the substrate.

6. The detector of claim 1, further comprising an enclosure.

7. The detector of claim 6, wherein the first, second, and third conductors are each positioned within the enclosure.

8. The detector of claim 3, wherein the detector is coupled to a wireless energy transfer system, and wherein the spatial region corresponds to a region through which electrical energy is transferred wirelessly between a wireless energy source of the system and a wireless energy receiver.

9. The detector of claim 1, wherein the second conductor surrounds portions of multiple surfaces of the substrate and comprises an opening, and wherein the first conductor is positioned within the opening.

10. A wireless energy transfer system, comprising:
    the detector of claim 1; and
    a wireless energy source positioned in proximity to the detector,
    wherein the wireless energy source is configured so that during operation of the system, the wireless energy source transfers energy wirelessly to a device configured to receive the energy.

11. The detector of claim 7, wherein the enclosure comprises a support surface configured to contact at least one of a floor surface and a ground surface, and at least one of the sensor and the shield is oriented at an angle with respect to the support surface.

12. A wireless energy transfer system, comprising:
    a chassis;
    a wireless energy source, wherein the wireless energy source is configured to transfer energy wirelessly to a wireless energy receiver; and
    a living object detection system positioned in proximity to the wireless energy source and comprising:
       a sensor comprising a first conductor positioned adjacent to a first surface of a substrate;
       a shield comprising a second conductor different from the first conductor, wherein at least a portion of the second conductor is positioned proximal to the first conductor and adjacent to the first surface of the substrate;
       a ground reference comprising a third conductor spaced from the substrate and positioned on a side of the substrate opposite to the first surface, wherein during operation of the living object detector, the third conductor is maintained at a ground reference electrical potential; and
       an electrical circuit coupled to the first, second, and third conductors and configured so that during the operation of the living object detector, the electrical circuit applies a first electrical potential to the first conductor and a second electrical potential to the second conductor, the first and second electrical potentials being approximately similar,
    wherein an extended portion of the second conductor is positioned between the wireless energy source and the chassis.

13. The system of claim 12, wherein the electrical circuit is configured so that during the operation of the living object detector, the electrical circuit:
    measures a capacitance of the sensor; and
    determines whether a living object is present within a spatial region proximal to the sensor based on the measured capacitance.

14. The system of claim 13, wherein the spatial region corresponds to a region through which electrical energy is transferred wirelessly between the wireless energy source of the device.

15. A living object detector for a wireless energy transfer system, comprising:
- a sensor comprising a first conductor positioned adjacent to a first surface of a substrate, wherein the sensor has a resistance $R_{sensor}$ and a capacitance $C_{sensor}$;
- a shield comprising a second conductor different from the first conductor, wherein at least a portion of the second conductor is positioned proximal to the first conductor and adjacent to the first surface of the substrate, and wherein the shield has a resistance $R_{shield}$ and a capacitance $C_{shield}$;
- a ground reference comprising a third conductor spaced from the substrate and positioned on a side of the substrate opposite to the first surface, wherein during operation of the living object detector, the third conductor is maintained at a ground reference electrical potential; and
- an electrical circuit coupled to the first, second and third conductors and configured so that during the operation of the living object detector, the electrical circuit:
  - applies a first electrical potential to the first conductor and a second electrical potential to the second conductor, the first and second electrical potentials being approximately similar; and
  - applies the first and second electrical potentials to the first and second conductors so that a parasitic capacitance between the first and second conductors is within 30% or less of a minimum value of the parasitic capacitance between the first and second conductors,
- wherein the minimum value of the parasitic capacitance between the first and second conductors occurs when a switching frequency at which the first and second electrical potentials are applied to the first and second conductors is less than $1/(R_{sensor}*C_{sensor})$ and less than $1/(R_{shield}*C_{shield})$.

16. The detector of claim 15, wherein the electrical circuit is configured so that during the operation of the detector, the electrical circuit:
- measures a capacitance of the sensor; and
- determines whether a living object is present within a spatial region proximal to the sensor based on the measured capacitance.

17. The detector of claim 16, wherein the detector is coupled to a wireless energy transfer system, and wherein the spatial region corresponds to a region through which electrical energy is transferred wirelessly between a wireless energy source of the system and a wireless energy receiver.

18. The detector of claim 15, wherein the second conductor surrounds portions of multiple surfaces of the substrate and comprises an opening, and wherein the first conductor is positioned within the opening.

19. The detector of claim 15, wherein the second conductor wraps around at least a portion of the substrate.

* * * * *